United States Patent [19]

Iwahashi et al.

[11] Patent Number: 4,542,485
[45] Date of Patent: Sep. 17, 1985

[54] SEMICONDUCTOR INTEGRATED CIRCUIT

[75] Inventors: Hiroshi Iwahashi, Yokohama; Masamichi Asano, Tokyo, both of Japan

[73] Assignee: Tokyo Shibaura Denki Kabushiki Kaisha, Japan

[21] Appl. No.: 337,969

[22] Filed: Jan. 8, 1982

[30] Foreign Application Priority Data

| Jan. 14, 1981 | [JP] | Japan | 56-4323 |
| Apr. 21, 1981 | [JP] | Japan | 56-60111 |
| Jun. 12, 1981 | [JP] | Japan | 56-90398 |
| Jul. 29, 1981 | [JP] | Japan | 56-118749 |
| Jul. 29, 1981 | [JP] | Japan | 56-118750 |

[51] Int. Cl.$^4$ ............... G11C 13/00; G11C 11/40
[52] U.S. Cl. ................................. 365/230; 365/189
[58] Field of Search .................. 365/189, 182, 230

[56] References Cited

U.S. PATENT DOCUMENTS 4,094,012 6/1978 Perlegos et al. .................. 365/226
4,096,584 6/1978 Owen, III et al. ................ 365/227

Primary Examiner—Terrell W. Fears
Attorney, Agent, or Firm—Finnegan, Henderson, Farabow, Garrett & Dunner

[57] ABSTRACT

A semiconductor integrated circuit comprises a first MOS transistor connected at the drain to a power source terminal of a high potential power source and supplied at the gate with a predetermined voltage, a logic circuit including MOS transistors provided between the power source terminal and a circuit point at a potential and operating in a potential range between the high potential and the circuit point, and a circuit for making the potential at the circuit point coincide with the potential at the source of the first MOS transistor.

13 Claims, 34 Drawing Figures

FIG. 5
PRIOR ART
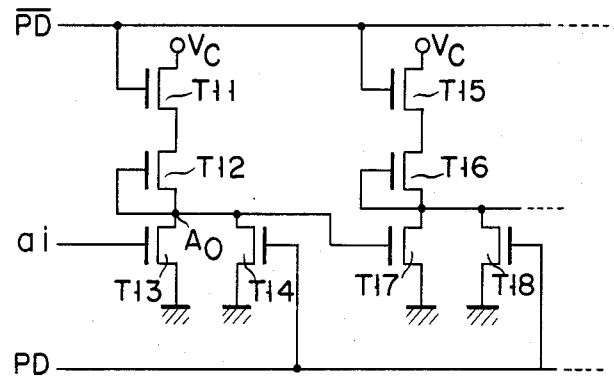
FIG. 6
PRIOR ART
FIG. 7
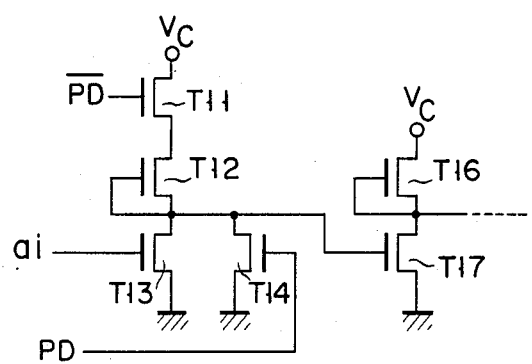

F I G. 12
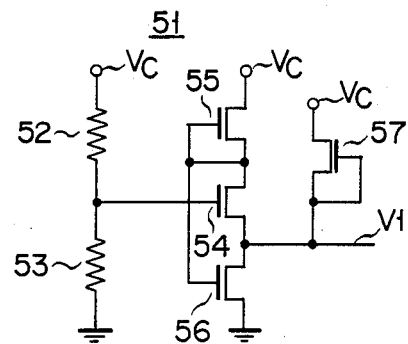
F I G. 13
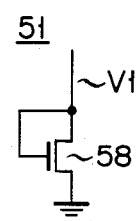
F I G. 14
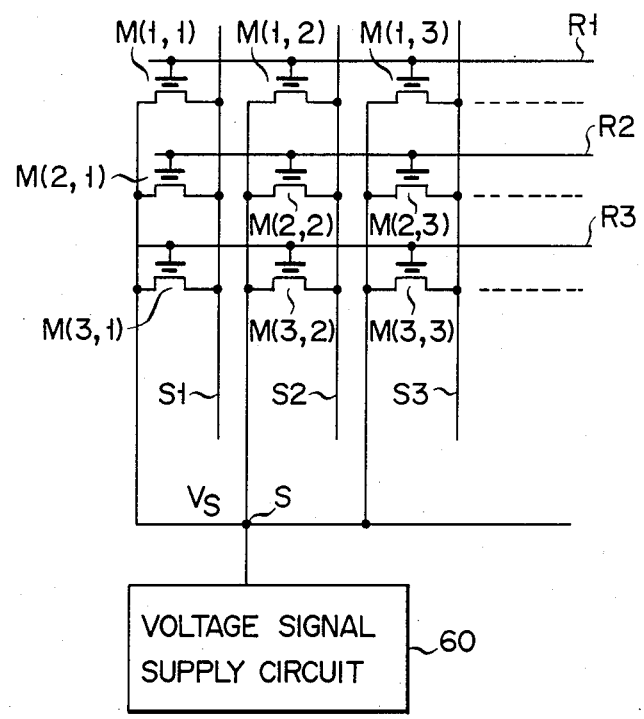

F I G. 15
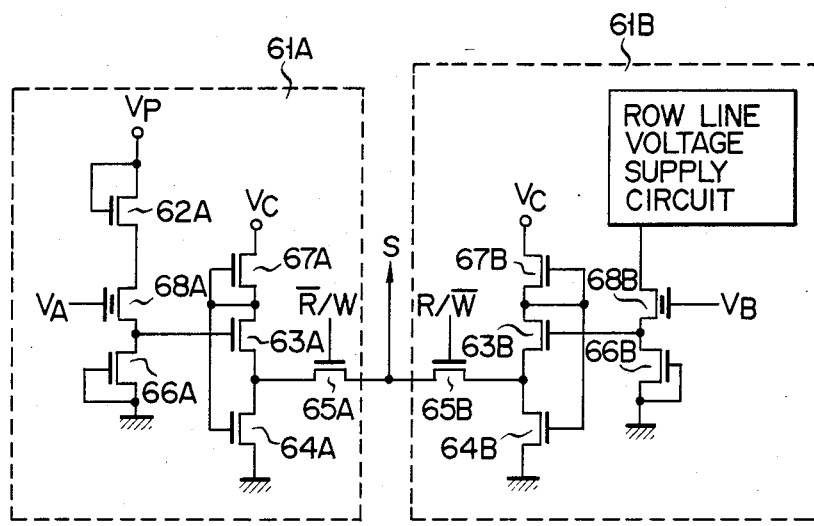
F I G. 16
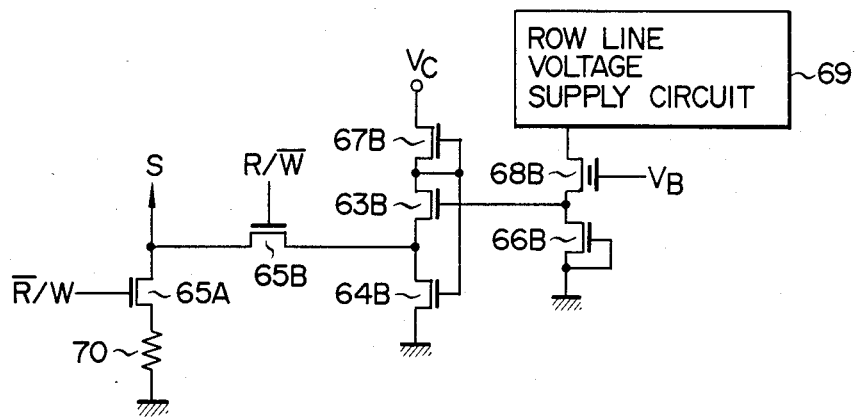

F I G. 17
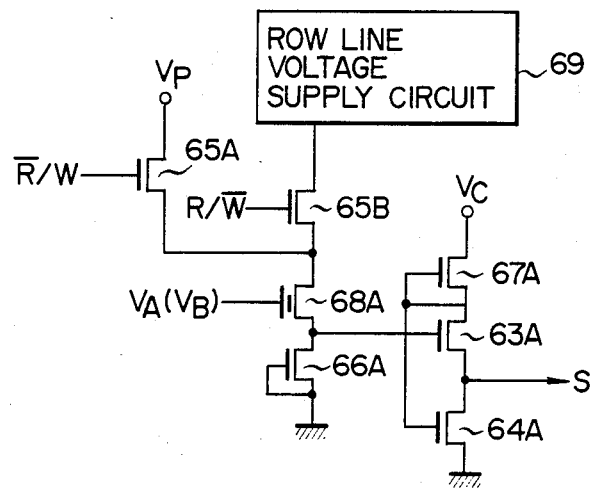
F I G. 18
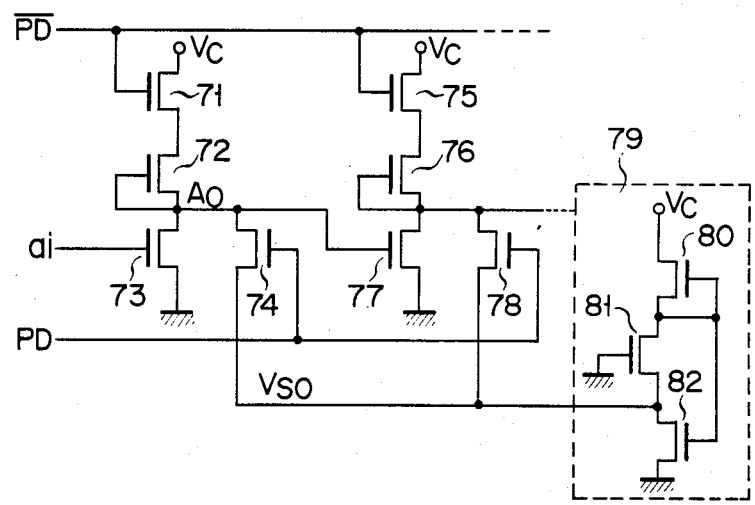

SEMICONDUCTOR INTEGRATED CIRCUIT

BACKGROUND OF THE INVENTION

The present invention relates to a semiconductor integrated circuit device.

In semiconductor integrated circuits, particularly MOS (metal oxide semiconductor) integrated circuits, the MOS transistors are more and more microminiatureized. With this tendency, the depth of the source and drain regions are shallowed or the length of the gate region i.e. the channel length or the thickness of the gate insulation film is reduced. Although the size of the MOS transistor and the thickness of the gate insulation film are more reduced, a power source voltage still employs a high voltage, for example, +5 V. It is for this reason that other integrated circuits, for example, TTL (transistor transistor logic), are fabricated into an overall system, and it is undesirable to use different power sources for the respective integrated circuits from a practical view point. Because of the high power source voltage, when impact ionization takes place in the vicinity of the drain region, electrons are injected into the gate insulation film, resulting in a variation of the threshold voltage. The variation of the threshold voltage causes various problems. A measure conventionally taken for raising the punch-through voltage is to raise an impurity concentration in the channel region by the iron implantation process.

The measure taken, however, not only complicates the manufacturing process of the semiconductor device but also needs much labors.

A conventional memory device, such as ROM, in which each memory cell is constituted of a single MOS transistor, is illustrated in FIG. 1. In the figure, memory cells M (1, 1), M (1, 2), . . . are disposed at cross points of row lines, R1, R2, . . . and column lines S1, S2, . . . , which are arranged orthogonal to the row lines. In reading data from the memory array thus constructed, a row line decoder 41 selects one of the row lines R1, R2, . . . and a column line decoder (not shown) selects one of the column lines S1, S2, . . . , so that a memory cell disposed at the cross point of the selected row line and the selected column line is specified to provide data stored therein. When the selected memory cell is connected at the drain to the column line, such as M (1, 1) and M (1, 3), the charge on the column line is discharged through the transistor and its potential is at "0" level. On the other hand, when the drain of the memory cell transistor is opened, the column line is charged by the power supplied from the power source through a load transistor (not shown) connected to the column line to have a potential of "1" level. In this manner, the data of "0" or "1" is read out from the memory cell.

In the above-mentioned ROM, since the single memory cell is constituted by a single transistor, it is possible to microminiaturize the memory cell transistor and hence to reduce the chip size. When the memory cell is made small, the channel length is also shortened correspondingly. The resultant short channel effect reduces the threshold value to pull the threshold voltage of the transistor to the negative value. The result is that the memory cells not selected are conductive. Under this condition, at the time of selecting the column line, the non-selected memory cells are turned on, so that the potential on the row line does not rise to fail to provide a "1" level signal. When the drain voltage is applied to the memory cell transistor, the height of the potential barrier between the source and the drain is limited to a low value, so that a current which is not very dependent on the gate voltage flows through the source-drain path. This current is a so-called space charge limiting current. The current punches through the source and drain. Under this condition, the charge potential on the column line does not rise. For this reason, there is a limit in microminiaturizing the memory cell and thus in improving an integration density of the ROM.

The non-volatile memory device using the MOSFET with a floating gate as the memory cell has the same problem of microminiaturizing the memory cells and the memory chips for increasing memory capacity. The reduction of the memory size indicates the shortening of the channel length. This leads to a problem of excessive reduction of the threshold voltage due to the short channel effect or the punch-through due to the drain voltage. When a high voltage is applied to the drain of the memory cell in a write mode of the memory device, the leakage current flows into the non-selected memory cell of which the gate voltage is 0 V. The leakage current is not negligible when the memory capacity of the memory is large, since the number of the drains of the memory cells connected to the same row line is large in such a case. This brings about a disadvantage that the data write characteristic is deteriorated since the drain voltage is dropped in a data write mode.

An example of the memory device developed for improving this problem is shown in FIG. 2. This memory device is designed on the basis of the concept that a fixed potential is applied from a voltage signal supply circuit 101 to the source of each memory cell T of the memory cell array in a data write mode, thereby to prevent the reduction of the punch-through voltage and the deterioration of the write characteristic in a write mode. Incidentally, R1, R2 and R3 are row lines and S1, S2 and S3 are column lines. As the voltage signal supply circuit 101, an arrangement as shown in FIG. 3 or FIG. 4 may be considered. The circuit shown in FIG. 3 is constituted of a resistor element (which may be a MOSFET) which is connected to the ground at one end and at the other end to a source connection point S of the memory cell T. In a write mode, a current of 1 mA to 2 mA flows into one memory cell and accordingly the source potential may be raised by the voltage drop across the resistor element R. On the other hand, in a data read mode, a current of about 100 $\mu$A or so flows into one memory cell. At this time, the source potential rises only a little.

In the circuit shown in FIG. 4, transistors T1 to T4 are of the enhancement type, transistors T5 and T6 are of the depletion type, and a transistor T0 has substantially the same size and characteristic as those of the memory cell T. Also in the circuit, Vc is normally a power source, $V_p$ is a power source for supplying a high voltage in a data write mode, $V_A$ a control potential amount equal to the potential on the non-selected row line in a memory array, R/W a control signal which is "1" in a read mode and "0" in a write mode. When a high voltage power $V_p$ is applied in a write mode, the drain of the transistor T0 is almost equal to that on the selected row line in the memory array, so that the source potential of the transistor T0 gradually rises due to the punch-through up to a value to stop the punch-through. The resistance of the transistor T5 is sufficiently large in preparation for the case when the source of the transistor T0 is at an abnormal potential due to noise or the like to discharge its high potential.

The threshold voltage of the transistor T2 is set at about 0 V, and its gate is at a voltage at which the punch-through of the transistor T0 equivalent to the memory cell stops. For this reason, the transistor T2 is cut off when the potential Vs at the source connection point S in the memory cell array reaches the potential at the gate of the transistor T2. The transistor T3 is connected to the power source Vc through the transistor T6. Accordingly, the gate potential rises and the transistor T3 turns on. As a result, the potential Vs at the source connection point S is set at a value to stop the punch-through of the transistor T0 equivalent to the memory cell, that is, to stop the punch-through of the non-selected memory cell of those memory cells. In the data write mode, a signal R/$\overline{W}$ is "0" and the transistor T4 is off. On the other hand, in the data write mode, the R/$\overline{W}$ signal is "1" and hence the transistor T4 is on, so that the source connection point S is kept at substantially 0 V.

With the further reduction of the memory size resulting from the large capacity of the memory, the channel length of the memory cell is even shorter. As a result of the shorter channel, the threshold voltage abnormally drops to a negative value. In this case, the leakage current in the read mode is not negligible in the memory cells. In this respect, there is a need for developing a means which sets the potential Vs at the source connection point S at a value higher than the gate potential of the non-selected memory cell not only in the write mode but also in the read mode.

The semiconductor integrated circuit is provided with means to stop the power supply to a circuit block in the integrated circuit when it is not used, for reducing the consumption of the power source current. For example, the semiconductor memory has a power down mode in which the memory chips not selected are made inoperative for the power saving.

In the integrated circuit with the power down function, MOS transistors T11 to T13 are connectd in series across the power source (between Vc and ground), as shown in FIG. 5. The load MOS transistor (referred to as a load transistor) T12 is an n-channel depletion MOS transistor and the drive MOS transistor (referred to as a drive transistor) T13 is an n-channel MOS transistor used as an inverter. The gate of the load transistor T12 and the drain of the drive transistor T13 are connected to each other to provide an output terminal A0.

An input signal ai is applied to the gate of the drive transistor T13. The power source Vc is supplied to the load transistor T12, through the MOS transistor T11 of the n-channel depletion type. The power supply control MOS transistor (referred to as a control transistor) T11 is gate-controlled by a power down mode signal $\overline{PD}$. The power down mode signal $\overline{PD}$ is "0" when the power down is carried out by using the inverted signal of the signal PD, that is, when the power saving is made by rendering the inverter inoperative, and is "1" when the power down mode is removed.

Further, a control MOS transistor T14 is provided between the output terminal A0 and ground, in parallel with the drive transistor T13. The control transistor T14 is an n-channel enhancement MOS transistor, for example, which is gate-controlled by the power down mode signal PD. The power down mode signal PD is "1" in the power down mode and "0" when the power down mode is removed.

Further, a circuit comprised of MOS transistors T15 to T18 is provided, like the circuit comprised of MOS transistors T11 to T14. The MOS transistor T17 is gate-controlled by a signal from the output terminal A0 of the inverter. The MOS transistors T15 and T18 are gate-controlled by the signals $\overline{PD}$ and PD, as in the above case.

In the integrated circuit, when the control transistor T11 is conductive, the power source Vc is supplied to the load transistor T12, and the control transistor T14 is in a cut-off state, the inverted signal of the input signal ai appears at the output terminal A0. At this time, power down mode signals $\overline{PD}$ and PD are "1" and "0", respectively. For setting the integrated circuit in the power down mode by rendering the circuit inoperative, the signals $\overline{PD}$ and PD are "0" and "1", respectively, so that the control transistor T11 is substantially in the cut-off state, while the control transistor T14 is in an on-state. In this way, the supply of the power voltage Vc to the load transistor T12 is stopped and a signal appearing at the output terminal A0 flows to ground through the control transistor T14.

To completely stop the power voltage Vc supply to the load transistor T12 at this time, i.e. in the power down mode, the threshold voltage Vth11 of the control transistor T11 must be above 0 V or more. In this case, when the power down is removed, that is, when the integrated circuit operates, a signal at "1" level appearing at the output terminal A0 of the inverter made up of the transistors T12 and T13 rises up to only a level of "Vc−Vth11", which is below the power source voltage Vc. Therefore, the power source margin of the integrated circuit is reduced.

On the other hand, in order to raise the output signal level to the substantial power source voltage Vc during operation of the integrated circuit, when the threshold voltage Vth11 of the control transistor T11 (of the depletion type) is set at a value of less than 0 V, the control transistor T11 is not cut off, if the power down signal $\overline{PD}$ is "0". Also, the current feed to the load transistor T12 continues, so that there is little power saving. When the threshold voltage Vth11 of the control transistor T12 is made negative, the reduction of the power source margin can be avoided. In this case, however, the current (flowing through the source-drain path) in the power down mode is sensitive to the threshold voltage Vth11 or the channel length of the control transistor T11, so that the current consumption varies greatly in the power down mode. In this respect, great care must be taken in setting the threshold voltage Vth11 or the channel length of the control transistor T11 when the transistor T11 is manufactured.

In addition to the power saving circuit in the integrated circuit, there is proposed another circuit, as shown in FIG. 6, in which a control MOS transistor is provided between drive transistors T13 and T17 making up an inverter and ground, and the control transistor is gate-controlled by the power down mode signal $\overline{PD}$. In such an integrated circuit, the signal $\overline{PD}$ is "0" in the power down mode, and the control transistor T20 is cut off, to save the power consumption. In this system, however, all the circuit points rise to the "1" level in the power down mode and the charges thereat are discharged when the power down mode is removed. The substrate potential is pulled down in the negative direction by the capacitive coupling of the substrate of the integrated circuit with the circuit points, so that the substrate potential varies to adversely influence the operation of the integrated circuit. At the time of releasing the power down mode, time must be taken for the drain voltage of the transistor T20 to change from "1" to "0" against the change of the signal $\overline{PD}$ from "0" to "1" when the power down mode is removed. In this case, the presence of the mirror feedback capacitance delays the releasing of the power down. In the system shown in FIG. 5, it is satisfactory that the control transistors T11 and T14 are connected every other inverter (MOS transistors T12 and T13, and T16 and T17). In the system shown in FIG. 6, the control transistors T11 and T14 must be connected to all of the inverters since the outputs of the inverters are at "1" level. In order to keep the drain potential of the control transistor T20 at about ground potential so as to ensure the normal operation of each inverter, the drive ability of the transistor T20 must be great, with the result that the chip area of the integrated circuit becomes large.

SUMMARY OF THE INVENTION

It is therefore an object of the invention to provide a semiconductor device in which the device elements can be microminiaturized to improve the integration density, free from the reduction of the punch-through voltage and a variation of the threshold voltage, with an arrangement that, although a high voltage power source used for the overall system is used for its power source, the semiconductor device per se can be supplied with a lower voltage than the overall system power source, and therefore the semiconductor device is operable at the lower voltage.

It is more specific object of the invention to provide a memory device with a large memory capacity in which the memory cells may be further microminiaturized thus with the size reduction of the memory device.

It is another object of the present invention to provide a semiconductor integrated circuit in which the power supply to a circuit made of MOS transistors is controlled in accordance with a power down mode signal to ensure the reduction of the power source current, and a satisfactory power source margin can be secured in a normal circuit operation mode.

It is yet another object of the present invention to provide a decoder circuit in which the reduction of the current consumption is reliably realized in accordance with a power down signal and a satisfactory power source margin is secured in a normal circuit operation mode.

According to the invention, there is provided a semiconductor integrated circuit device comprising: a first MOS transistor connected at one end of the drain-source path to a high potential power source terminal and supplied at the gate with a predetermined voltage; a logic circuit provided between said high potential power source terminal and a circuit point at a proper potential and operating in a voltage range between the potential at said high potential terminal and the potential at said circuit point; and a circuit operating so that the potential at said circuit point is made coincident with the potential at the other end of said drain-source path of said first MOS transistor.

According to the invention, there is further provided a semiconductor memory device comprising: a plurality of column lines; a plurality of row lines; memory cells each constituted of a MOS transistor disposed at cross points of said column lines and said row lines; and means connected between a high potential power source and a low potential power source for applying a signal at a given potential between said high and low potentials to one end of the drain-source path of said MOS transistor constituting each memory cell.

According to the invention, there is further provided a semiconductor memory device comprising: a plurality of column lines; a plurality of row lines; memory cells each constituted of a MOS transistor disposed at the cross points of said column lines and said row lines; and means for applying a higher potential than the gate potential of a non-selected memory cell to the source of said memory cell in a write mode and a read mode.

According to the invention, there is still further provided a semiconductor integrated circuit device comprising: a control MOS transistor of the depletion type gate-controlled by a first input signal; a drive MOS transistor supplied with the power source voltage through said control MOS transistor and gate-controlled by a second input signal; and means for applying a voltage higher than the gate voltage or more to the source of said control MOS transistor in a power down mode.

According to the invention, there is further provided a semiconductor integrated circuit device comprising: a control MOS transistor of the depletion type gate-controlled by a first input signal; a drive MOS transistor supplied with a power source voltage through said control MOS transistor and gate-controlled by a second input signal; and means for connecting the drain and gate of said drive MOS transistor in a power down mode.

According to the invention, there is still further provided a semiconductor integrated circuit device comprising: a logic circuit including a plurality of stages of MOS transistor circuits each made up of a control MOS transistor of the depletion type gate-controlled by a first input signal and a drive MOS transistor supplied with the power source voltage through said control MOS transistor and gate-controlled by a second input signal; and means for electrically connecting the drain and source of said drive MOS transistor of said MOS transistor circuit of each stage in a power down mode.

According to the invention, there is further provided a semiconductor integrated circuit device comprising: a circuit including a plurality of MOS transistor circuits each made up of a control MOS transistor of the depletion type gate-controlled by a first input signal and drive MOS transistor supplied with a power source voltage through said control MOS transistor; a connection line for connecting the drain of said drive MOS transistor of the prestage with the gate of said drive MOS transistor of the poststage; first means for interconnecting the drains and the gate of said drive MOS transistor of the respective stages except the first stage; and second means for shutting off the source current of said drive MOS transistor of the first stage in a power down mode.

According to the invention, there is further provided a decoder circuit comprising: a main decoder including a plurality of first MOS transistors connected in parallel one another for receiving at the gates a selection signal, a first MOS transistor for receiving at the gate a first input signal connected between a high potential power source and one end of the drain-source path of each of said first MOS transistors, a plurality of second MOS transistors connected between said one ends of said first MOS transistors and word lines corresponding to said one ends, a plurality of third MOS transistors of which drain-source paths are respectively connected at one ends to the word line side terminals of said second MOS transistors, and a second control MOS transistor of which the drain-source path is connected at one end to said one ends of the drain-source paths of said first MOS transistors, and receives at the gate a second input signal out of phase with respect to said first input signal; and means connected to the other end of said second control MOS transistor in said main decoder, and for supplying a potential of the gate potential of said first control MOS transistor or more to the source of said first control MOS transistor in a power down mode.

According to the invention, there is still further provided a semiconductor integrated circuit device comprising: circuitry including MOS transistors connected between a high potential power source and a low potential power source; and at least part of said circuitry connected between said high potential power source and a voltage signal supply means for providing a potential within a range between the potentials produced by said high and low potential power sources.

BRIEF DESCRIPTION OF THE DRAWINGS

FIGS. 5, 6 and 7 are circuit diagrams of prior art semiconductor integrated circuits with a power down function;

FIG. 12 is a circuit diagram of a voltage signal supply circuit in the embodiment shown in FIG. 10;

FIG. 13 is another circuit of the voltage signal supply circuit in the embodiment shown in FIG. 10;

FIG. 14 shows an embodiment when a semiconductor integrated circuit according to the present invention is applied for the non-volatile semiconductor device;

FIG. 15 is a circuit diagram of a voltage signal supply circuit in the embodiment shown in FIG. 14;

FIG. 16 is another circuit diagram of a voltage signal supply circuit in the embodiment shown in FIG. 15;

FIG. 17 is yet another circuit diagram of the voltage signal supply circuit in the embodiment shown in FIG. 15;

FIG. 18 shows an embodiment when a semiconductor integrated circuit according to the present invention is applied to an integrated circuit with a power down function;

DETAILED DESCRIPTION OF THE PREFERRED EMBODIMENTS

Figure 8:
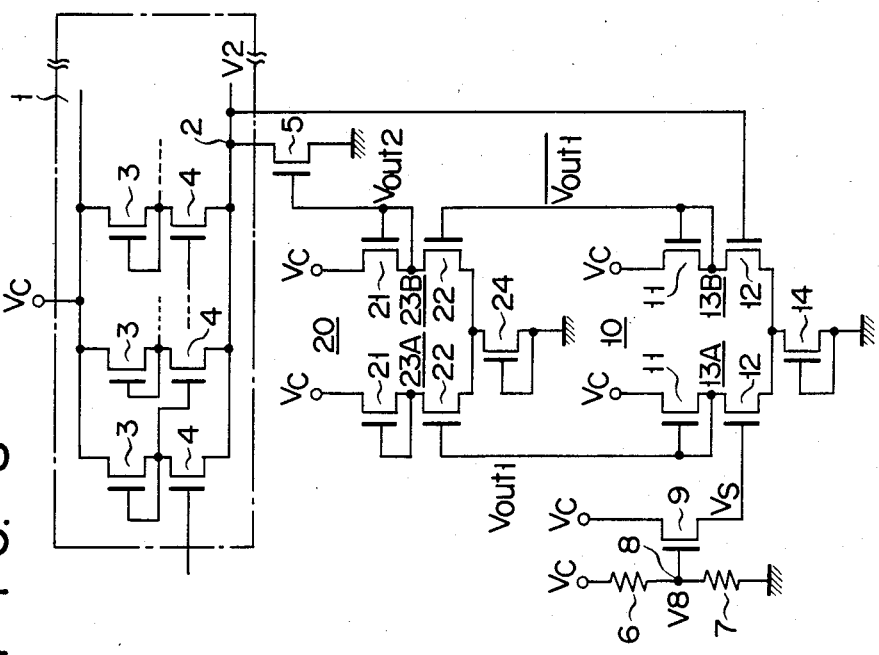
FIG. 8 is a circuit diagram of a semiconductor integrated circuit device according to the present invention.

In a semiconductor integrated circuit device shown in FIG. 8, a logic circuit 1 is comprised of a plurality of cascade-connected E/D inverters each having a load MOS transistor of the depletion type and a drive MOS transistor 4 of the enhancement type, which are connected in series between a point for applying an external power source voltage Vc of $+5$ V, for example and a circuit point 2.

The drain-source path of a MOS transistor 5 of, for example, the enhancement type is connected between the circuit point 2 and a reference potential, e.g. a ground potential. Two resistive elements 6 and 7 are inserted in series each other between the high potential power source voltage Vc and the reference potential. The power source voltage Vc is divided by a combination of the resistive elements 6 and 7, so that a voltage V8 according to the voltage dividing ratio is obtained from a junction point 8 between the resistors 6 and 7. The drain of the MOS transistor 9 of the enhancement type is connected to the power source voltage Vc applying point. The gate of the MOS transistor 9 is connected to the junction point 8 so as to provide a junction voltage V8 to the gate of the transistor 9.

A differential amplifier 10 comprises a pair of amplifier units 13A and 13B respectively comprised of depletion type load MOS transistors 11 and depletion type drive MOS transistors 12, and a depletion type MOS transistor 14 as a current source. A source voltage Vs of the MOS transistor 9 is applied to the gate of the drive MOS transistor 12 of the amplifier unit 13A. A voltage V2 at the circuit point 2 is supplied to the gate of the drive MOS transistor 12 of the amplifier unit 13B. The output signals Vout1 and $\overline{\text{Vout1}}$ from the amplifier units 13A and 13B in the amplifier 10 are supplied to another differential amplifier 20.

The differential amplifier 20 comprises a pair of amplifier units 23A and 23B each composed of a depletion type load MOS transistor 21 and a depletion type drive MOS transistor 22, and a depletion type MOS transistor 24 as a current source. The output signals Vout1 and $\overline{\text{Vout1}}$ from the differential amplifier 10 are respectively supplied to the gate of the drive MOS transistor 22 in the amplifier unit 23A and the gate of a drive MOS transistor 22 of the amplifier unit 23B. The output signal Vout2 of the amplifier unit 23B in the differential amplifier 20 is supplied to the gate of the MOS transistor 5.

The transistors used in the above-mentioned arrangement are all of n-channel type.

The operation of the circuit as mentioned above will be described.

The power source voltage Vc is supplied to the drain of the MOS transistor 9, and the setting voltage V8 is supplied to the gate of the transistor 9. The source potential Vs of the MOS transistor 9 is normally kept at $V8-V_{TH}$ ($V_{TH}$ is the threshold voltage of the transistor 9). For example, when V8 is $-0.5$ V and $V_{TH}$ is $-0.5$ V as the result of the punch-through or short-channel effect of the transistor 9, the source voltage Vs is constant at $+1.0$ V. The source potential Vs of the MOS transistor 9 is supplied as one of the inputs to the differential amplifier circuit 10. Accordingly, the potential V2 at the circuit point 2 is set at a value equal to the potential Vs. When the Vs is $+1.0$ V, the V2 is also set at $+1.0$ V. Accordingly, the logic circuit 1 operates between $+5$ V and $+1$ V.

When the threshold voltage $V_{TH}$ of the MOS transistor 9 is dropped by the punch-through and the short-channel effect, and the like, the source potential Vs rises by the dropped amount of the voltage $V_{TH}$. As the result of the rise of the source potential Vs, a back gate bias is applied to the MOS transistor 9 to such an extent as to compensate for the dropped amount of the threshold voltage $V_{TH}$. Therefore, the apparent threshold voltage $V_{TH}$ of the MOS transistor 9 returns to the value before it is dropped. As previously stated, the potential V2 of the circuit point 2 is set at a value equal to the Vs, so that the potential V2 at the circuit point 2 rises by a change of the $V_{TH}$. If the change of the $V_{TH}$ is $-0.5$ V, Vs is $+1.5$ and the potential V2 is also $+1.5$ V. In this case, the logic circuit 1 operates between $+5$ V and $+1.5$ V, i.e. a smaller voltage range than that before the $V_{TH}$ changes.

As described above, in the present embodiment, the logic circuit 1 operates with a voltage range of the voltage applied to the logic circuit 1, which is narrower than that of the voltage supplied from the external power source. Therefore, if the MOS transistors 3 and 4 in the logic circuit 1 are microminiaturized, there arises no problem of the reduction of the punch-through voltage or the variation of the the $V_{TH}$. In the above embodiment, the circuit is so arranged that the lower potential, i.e. the potential V2 at the circuit point 2, is made high. With this circuit arrangement, the back gate bias is applied to the MOS transistors 3 and 4 in the logic circuit 1, thereby to reduce the diffusion capacitance. The reduction of the diffusion capacitance and the capacitance reduction due to the microminiaturization of the elements cooperate to further facilitate an operation speed of the semiconductor device.

Figure 1:
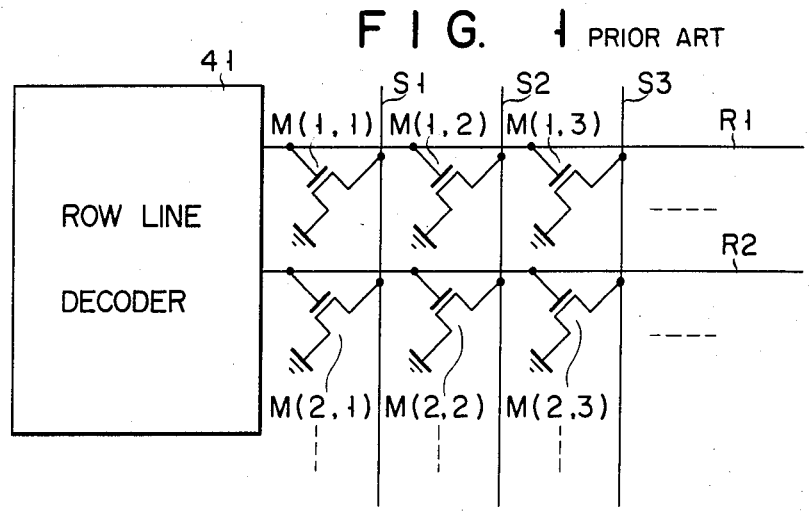
FIG. 1 is a circuit diagram of an example of a prior art ROM.
Figure 2:
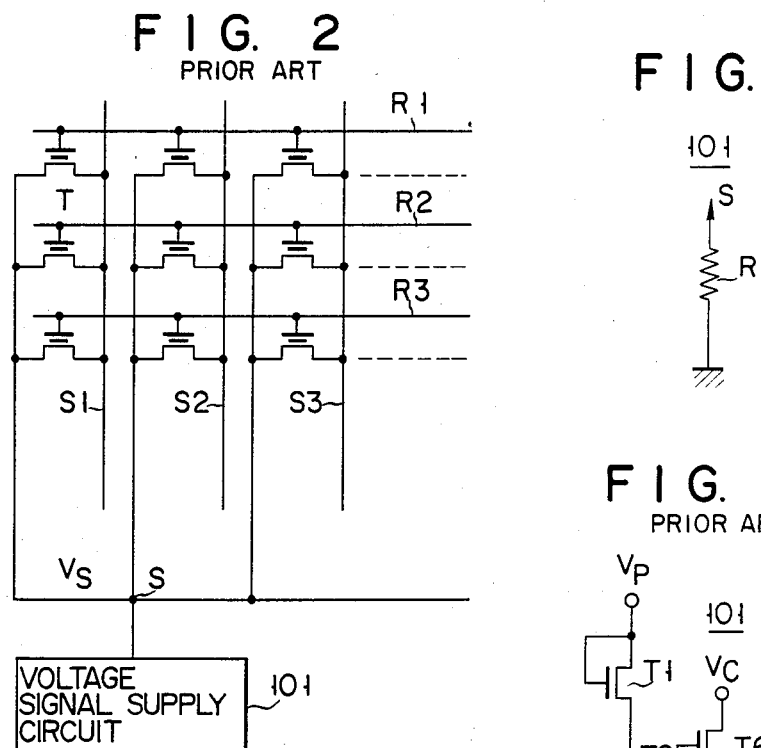
FIG. 2 is a circuit diagram of a prior art non-volatile semiconductor memory.
Figure 3:
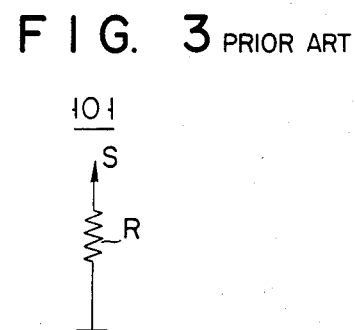
FIGS. 3 and 4 illustrate prior art voltage signal supply circuits in the memory device shown in FIG. 2.
Figure 4:
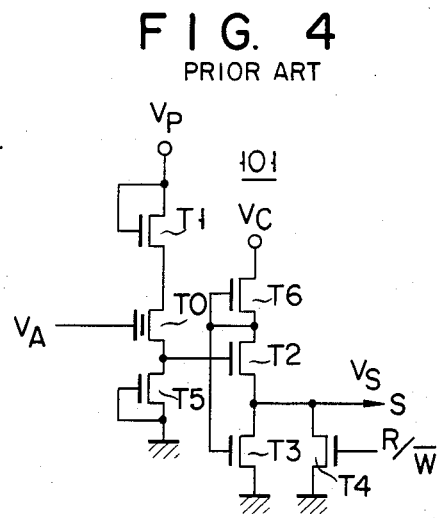
Figure 9:
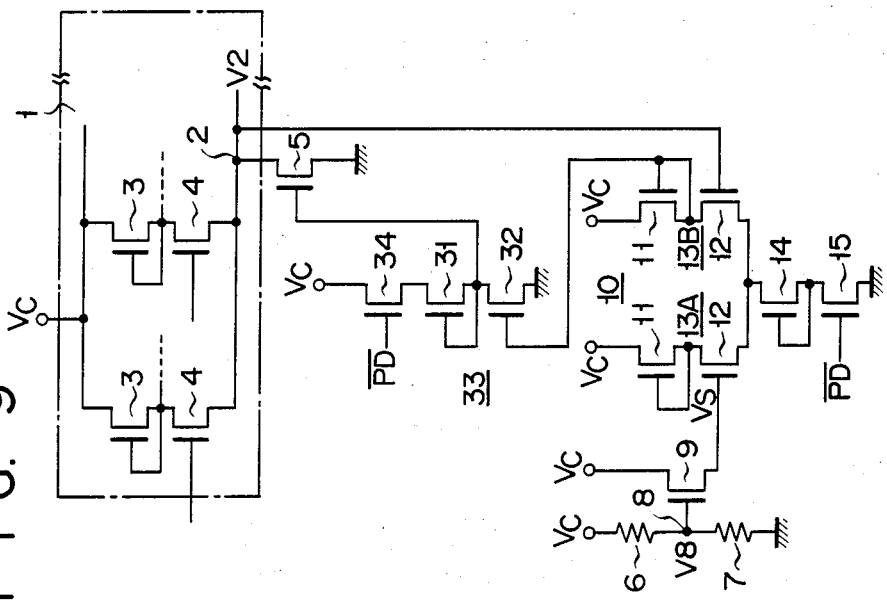
FIG. 9 is a circuit diagram of a modification of the circuit shown in FIG. 8.

FIG. 9 shows another embodiment of a semiconductor integrated circuit device according to the present invention. In distinctive features of this embodiment from the FIG. 8 embodiment, an amplifier circuit 33 composed of a load MOS transistor 31 of the depletion type and a drive MOS transistor 32 of the enhancement type, is used in place of the differential amplifier 20. The output signal $\overline{Vout1}$ from the differential amplifier 10 is amplified by the amplifier 33, and the signal amplified is supplied to the gate of the MOS transistor 5. The amplifier 33 and the differential amplifier 10 are respectively provided with enhancement type MOS transistors 15 and 34 which are turned off with the power down signal $\overline{PD}$ supplied when the device is inoperative. For simplicity of the explanation, like symbols are used for designating like portions. The power down signal $\overline{PD}$ is for shutting off the power supply to the amplifiers 33 and 10.

In the embodiment shown in FIG. 9, the MOS transistors 15 and 34 are both OFF when the logic circuit 1 is not operated. Accordingly, the current consumption in the amplifiers 10 and 33 is almost zero when these are not operated.

In the FIGS. 8 and 9 embodiments, the plurality of the cascade-connected E/D inverters make up the logic circuit 1. Any suitable circuit arrangement, if containing MOS transistors, may be used for the logic circuit, in place of the above one. The logic circuit may be made up of CMOS (complementary MOS) element. The differential amplifier 10 for controlling the potential V2 at the circuit point 2 may be substituted by any circuit if it can produce a potential signal substantially equal to the source potential of the MOS transistor 9.

In the cascade-connected inverter arrangement shown in FIG. 8, the output terminal of the preceding stage, i.e. the junction of the MOS transistors 3 and 4, is connected to the gate of the transistor 4 in the succeeding stage inverter. The arrangement is partially illustrated for simplicity in FIGS. 8 and 9.

The FIG. 9 embodiment attains the same effects as those obtained by the FIG. 8 embodiment. That is, the MOS transistors can be microminiaturized without the problem of the punch-through voltage reduction and the variation of the threshold voltage variation, thereby to secure a high operation speed of the device.

Figure 10:
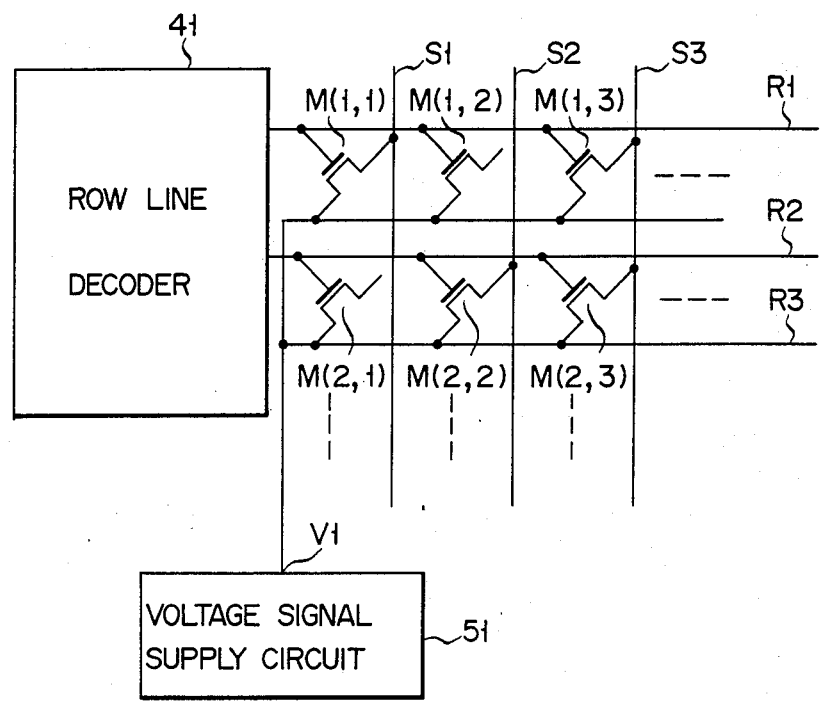
FIG. 10 is a circuit diagram of an embodiment of a ROM containing a semiconductor integrated circuit device of the present invention.

FIG. 10 illustrates an embodiment when a semiconductor integrated circuit device of the this invention is applied for the ROM (Read Only Memory). In FIG. 10, memory cells M (1, 1), M (1, 2), M (1, 3), . . . are disposed at the cross points of row lines R1, R2, R3, with column lines S1, S2, S3, . . . orthogonally disposed with respect the row lines. A memory cell at a cross point of one of the row lines selected by a row line decoder 41 with one of the column lines selected by a column line decoder (not shown), is selected to provide data stored therein. If the selected memory cell is connected at the drain to the column line, such as the cells M (1, 1) and M (1, 3), the charge on the column line is discharged through the transistor to be at "0" level. In the case of the memory cell transistor of which the drain is open, such as the cells M (1, 2) and M (2, 1), the potential on the column line becomes "1" in level since it is charged with the power supplied from the power source through the load transistor (not shown) connected to the column line. In this way, the data "1" or "0" is read out from the memory cell selected.

Figure 11:
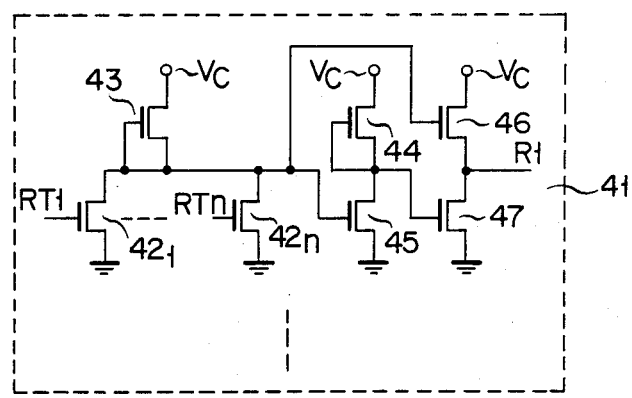
FIG. 11 is a circuit diagram of a row line decoder in the embodiment shown in FIG. 10.

FIG. 11 shows a circuit arrangement of the row line decoder 41 in the ROM in FIG. 10. The decoder 41 is comprised of MOS transistors $41_1$ to $42_n$, supplied at their gates with row line selection signals or address data RT1 to RTn, a depletion type MOS transistor 43 connected to the ends of these transistors $42_1$ to $42_n$ for applying the power source voltage Vc, and a row line selection circuit comprised of transistors 44, 45, 46 and 47 for supplying to the row line R1 signals representative of the contents of selection signals RT1 to RTn applied to the transistors $42_1$ to $42_n$. In FIG. 11, there is illustrated only one decoder connected to the row line R1, for simplicity. In practical use, the number of the decoder circuits corresponding to the number of the row lines are used. The circuit construction of the remaining ones is the same as that in FIG. 11.

In FIG. 11, when the selection transistors $42_1$ to $42_n$ are all OFF, the power source voltage Vs is supplied through the transistor 46 to the row line R1. When the ON state transistor is present in those transistors $42_1$ to $42_n$, the row line R1 is discharged through the transistor 47 to be at the reference potential. Accordingly, it is possible to select a given row line by the selection signals RT1 to RTn. The selection of the column line is possible by the column line decoder (not shown) with a construction similar to that of the selection decoder 41. Therefore, it is possible to select a memory cell at a cross point of the row line selected and the column line selected.

In the ROM, one memory cell is constituted of a single transistor. Accordingly, the chip size of the ROM may be reduced by microminiaturing the memory cell transistors. In this case, however, the memory cell transistors must be operated within a smaller voltage range than that of the external power source, for the reason as mentioned referring to FIGS. 8 and 9. This is realized by connecting to the source of the memory cell transistor a voltage signal supply circuit 51 for producing a voltage V1 between the high potential power voltage Vc and the low potential power source voltage, for example, ground level. Since the voltage signal supply circuit 51 is connected commonly to the sources of the memory cell transistors, a proper voltage V1 is supplied to between the power source voltge Vc and the ground potential. Therefore, the "0" level of the signal applied to the gate of the memory cell transistor is negative as seen from the source of the memory cell transistor. The backgate bias of the memory cell MOS transistor is additionally applied by the potential V1. Thus, the back bias additionally containing the potential V1 is applied to the gate of the memory cell MOS transistor. Therefore, it operates in a narrower voltage width than that of the external power source voltage. For this reason, if the channel length is made shorter than the conventional one, it is possible to prevent the reduction of the threshold voltage due to the channel effect and the generation of the punchthrough.

FIG. 12 shows an example of a practical arrangement of the voltage signal supply circuit 51. The arrangement shown in FIG. 12 provides a given potential V1 by using transistors comparable with the memory cell transistors in the size and characteristic, for example. As shown, resistors 52 and 53 are connected in series between a power source voltage Vc applying point and ground. A junction point between the resistors 52 and 53 is connected to the gate of a MOS transistor 54 comparable with the memory cell MOS transistor. A voltage dependent on the voltage dividing ratio of the resistors 52 and 53 is applied to the gate of the transistor 54. One end of the drain-source path of the transistor 54 is connected to a depletion type MOS transistor 55, while the other end is connected to an enhancement type MOS transistor 56. A series circuit of the MOS transistors 54 to 56 is connected between the power source voltage Vc applying point and ground. The gate and source and, the transistor 55 are interconnected of their junction is connected to the gate of the transistor 56. The MOS transistor 57 of the depletion type of which the gate and source are interconnected is provided between the power source voltage Vc applying point and the junction between the MOS transistors 54 and 56. A signal of the potential V1 is derived from the junction between the MOS transistors 54 and 56. The power source voltage is applied through the depletion type transistor 57 to the junction between the transistors 54 and 56 from which the potential V1 is derived.

With such arrangement, by controlling the gate of the transistor 54 while keeping the potential at the junction between the resistors 52 and 53 substantially equal to that on the non-selected row line, the output potential V1 from the voltage signal supply circuit is determined by the power source voltage Vc supplied through the transistors 55 and 54 and the power source voltage Vc supplied through the transistor 57. When the potential V1 rises, the transistor 54 is turned off and the potential at the junction between the transistors 55 and 54 abruptly rises. As a result, the gate potential of the transistor 56 rises and the resistance of the transistor 56 when it is conductive decreases. The result is that the potential at the output side is discharged through the transistor 56 to keep the potential V1 constant. Therefore, the non-selected memory cell is prevented from being conductive. This enables the memory cells to be microminiaturized, improving the integration density.

FIG. 13 shows another circuit of the voltage signal supply circuit 51. In this arrangement, the potential V1 is determined by the threshold voltage of the MOS transistor. The potential V1 is formed by grounding the source of each MOS memory cell transistor through a MOS transistor 58 with a threshold voltage V1 of which the drain and gate are interconnected. Use of the voltage signal supply circuit in this embodiment of course allows the microminiaturization of the memory cell transistor.

This invention thus far has been described applied for ROMs, but is also applicable for programmable RAMs (Random Access Memory).

FIG. 14 shows an embodiment when the present invention is applied for a non-volatile memory device which employs a MOS transistor with a floating gate for a nonvolatile semiconductor memory.

Memory cells M (1, 1), M (1, 2), ... each constituted of the MOS transistor with a floating gate are disposed at the cross points of the row lines R1, R2, R3, ... and column lines S1, S2, S3, ... A voltage signal supply circuit 60 is connected commonly to the sources of the memory cell MOS transistors. The voltage signal supply circuit 60 sets the potential at the source of each memory cell MOS transistor at a higher value than that at the gate of the non-selected memory cell not only in the write mode but also in the read mode. As a result, the non-selected memory cell is cut off. This permits microminiaturization of the MOS transistors as memory cells.

The arrangement of the voltage signal supply circuit 60 will be described referring to FIG. 15. The signal supply circuit 60 is composed of a first voltage signal supply circuit section 61A for data write and a second voltage signal supply circuit section 61B for data read. Transistors 62A to 65A and 62B to 65B are of the enhancement type, and the transistors 66A and 67A and 66B and 67B are of the depletion type. The transistors 68A and 68B have the same structure as that of the non-volatile memory cells. $V_p$ is a power source voltage which becomes high in a write mode (substantially equal to the high potential applied to the memory cell). $V_A$ designates a control signal at a potential substantially equal to that on the non-selected row line in a memory cell array in a write mode. $V_B$ is a row line potential signal for producing a potential substantially equal to the nonselected row line potential in the memory cell array in a read mode. R/$\overline{W}$ is representative of a signal which is "0" in level in a write mode. $\overline{\text{R/W}}$ represents a control signal which is "0" in a read mode and "1" in a write mode.

An arrangement of the signal supply circuit section 61A will be described. The gate and drain of the transistor 62A is connected to the power source Vp, and its source is connected to the drain of the transistor 68A. A control signal $V_A$ is applied to the gate of the transistor 68A and the source thereof is connected to the drain of the transistor 66A. The gate and the source of the transistor 66A are grounded. The source of the transistor 68A is connected to the gate of the transistor 63A. The drain of the transistor 63A is connected to the source of the transistor 67A. The drain of the transistor 67A is connected to the power source $V_c$, and the gate and source of it are connected to the gate of the transistor 64A. The transistor 64A is connected at the source to ground and at the drain to the source of the transistor 63A and to the source of the transistor 65A. A transistor 65A is supplied at the gate with the $\overline{\text{R/W}}$ signal, and at the drain to the source connection point S of the memory cell array.

The arrangement as mentioned above constitutes a first signal supply circuit 61A for data write. The second signal supply circuit 61B for data read has a construction similar to that of the first signal supply circuit 61A, and hence no further explanation of the construction will be described.

The operation of the embodiment shown in FIG. 15 will be described.

Upon the application a high potential power source $V_p$ in a read mode, the potential at the drain of the transistor 68A approximates the potential on the row line selected in the memory cell array. The source potential of the transistor 68A gradually increases due to the punch-through or the like until the punch-through disappears. The threshold voltage of the transistor 63A is set at about 0 V and the gate thereof is set at a voltage for making the punch-through disappear. With this potential setting, when the potential Vs at the connection point S in the memory cell array reaches the potential at the gate of the transistor 63A, the transistor 63A is OFF. Since the transistor 64A is connected at the gate to the power source Vc through a transistor 67A, the potential at its gate rises to turn off the transistor 64A itself. When the transistor 64A is ON and the its drain potential drops, the transistor 63A turns on and the gate potential of the transistor 64A also drops. As result, the resistance value of the transistor 64A at conductive state becomes large and the drain potential again rises. For this reason, the potential $V_s$ at the junction point S of the sources is set at a potential for making the punch-through of the transistor 68A disappear, that is, a potential for making the punch-through in the memory cell disappear. That is to say, the potential Vs at the source junction point S of the memory cell array rises to a potential for turning off the memory cell in a non-selected state in the memory cell array if the memory cell has a negative threshold voltage. In this case, since the $\overline{\text{R/W}}$ signal is "1", the transistor 65A is ON, while the transistor 65B in the voltage signal supply circuit 61B is OFF since the $\overline{\text{R/W}}$ is "0".

The second voltage signal supply circuit 61B is for setting the potential at the source connection point S in a read mode through an operation similar to that of the first voltage signal supply circuit 61A. That is to say, in a read mode, the source potential of the transistor 68B rises until the transistor 68B is turned off. The source potential of the transistor 63B (of which the threshold voltage is almost 0 V) which is supplied at the gate with the source potential is almost equal to the source potential of the transistor 68B. In other words, the potential $V_s$ at the source connection point S in the memory cell array rises to such an extent to turn off the memory cell in a non-selected state in the memory cell array if that memory cell has a negative threshold voltage. At this time, since the $\overline{\text{R/W}}$ signal is "1", the transistor 65B is ON, while the transistor 65A of the first voltage signal supply circuit 61A is OFF since the $\overline{\text{R/W}}$ is "0". The potential $V_s$ at the source connection point S in a read mode is smaller than that in a write mode. The row line voltage supply circuit 69 is for applying a given potential to the row lines R1, R2, R3, ..., and its construction is well known and therefore the explanation thereof will be omitted.

FIG. 16 shows a modification of the circuit shown in FIG. 15. In this modification, a resistor 70 is used in place of the transistors 62A to 64A and 66A to 68A in the first voltage supply circuit 61A in FIG. 15. The resistor 70 is connected between one end of the transistor 65A and the ground terminal. In a write mode, the potential Vs at the source connection point S is produced through the voltage drop across the resistor 70.

FIG. 17 is another modification of the circuit shown in FIG. 15. In the modification, portions in the first and second voltage supply circuits 61A and 61B are replaced by a single circuit section with the same function. More specifically, the transistors 62A, 68B, 63B, 64B, 66B and 67B are omitted, and the control signals $V_A$ and $V_B$ are applied to the gate of the transistor 68A in a write mode and in a read mode, respectively. The power source $V_p$ is coupled with the drain of the transistor 68A, through the transistor 65A and further to the row line voltage supply circuit 69 through the transistor 65B. A control signal $\overline{\text{R/W}}$, which is high, in a write mode, and is substantially equal to the power source $V_p$, and 0 V in a read mode, is applied to the gate of the transistor 65A. An R/$\overline{\text{W}}$ signal, which is 0 V in a write mode and substantially equal to the power source voltage $V_c$ in a read mode, is applied to the gate of the transistor 65B. Accordingly, the potential at the drain of the transistor 68A is switched to the column line potential of the memory cell in accordance with the operation modes of the ROM. The source potential of the transistor 68A is applied to the gate of the transistor 63A (of which the threshold voltage is about 0 V). The potential Vs at the source connection point S is set at such a value as to turn off the nonselected memory cell in the memory cell array. In this embodiment, the transistors 68A and 68B each with a similar construction to that of the memory cells are used so that the source potential of the memory cell changes following the change of the configuration of the memory cell. The source potential of the memory cell may be set at a proper potential if the potential formed by the voltage dividing is inputted into the gates of the transistors 63A and 63B.

As described above, the sources of the memory cell MOS transistors are connected to the voltage signal supply circuit 60 which sets the source potential of each memory cell in the memory cell array at a potential higher than the gate potential of the non-selected memory cell in both write and read modes. With this connection, the non-selected memory cell may be at cut off state, thus enabling the microminiaturation of the memory cells.

FIG. 18 illustrates yet another embodiment of the present invention. This embodiment has a power down function which shuts off the power supply to a partial circuit block of an integrated circuit when the partial circuit block is in an inoperative state.

As shown, transistors 71 to 73 are connected in series across a power source, i.e. between a high potential power source voltage $V_c$ and ground, for example. A load MOS transistor 72 of the n-channel depletion type and a drive MOS transistor of the n-channel enhancement type make up an inverter. The drain of the load transistor 72 and the drain of the drive transistor 73 are connected to provide an output terminal A0. An input signal ai, which is supplied from a similar circuit to that of FIG. 18 or an external circuit of the integrated circuit, is inputted into the gate of the drive transistor 73. The power source $V_c$ is supplied through the MOS transistor 71 to the load transistor 72. The power supply (control) MOS transistor 71 is under control of a power down mode signal $\overline{PD}$. This power down mode signal, as the inverted signal PD, is logic "0" in a power down mode, in which the inverter is made inoperative to effect the power saving, while is logic "1" when the power down mode terminates. A control MOS transistor 74 is provided between the output terminal A0 and ground in parallel with the drive transistor 73. The control transistor 74 is of the n-channel enhancement type and gate-controlled by the power down mode signal PD which is logic "1" in a power down mode and logic "0" when the 10 power down mode terminates.

Another circuit block made up of transistors 75 to 78 is further provided, having much the same circuit construction as the circuit block made up of the transistors 71 to 74. The drive MOS transistor 77 is gate-controlled by a signal derived from the output terminal A0 of the inverter. The MOS transistors 75 and 78 are gate-controlled by the power down signals PD and $\overline{PD}$, respectively. A voltage signal supply circuit 79 applies a voltage Vso to the sources of control transistors 74 and 78 which are conductive in a power down mode.

The voltage signal supply circuit 79 is composed of MOS transistors 80 to 82 connected in series between the power source voltage $V_c$ and ground. The MOS transistor 80 of depletion type, of which the gate and source are interconnected, supplies the power source voltage $V_c$ to the MOS transistor 81. The transistor 81, grounded at the gate, produces a voltage Vso at the source. The source of the MOS transistor 81 and the drain of the MOS transistor 82 are interconnected. The MOS transistor 82 is connected at the gate to the source of the MOS transistor 80 and grounded at the source.

In the integrated circuit thus constructed, the power down signals $\overline{PD}$ and PD are "0" and "1" in a power down mode. Under this condition, the control transistor 74 is conductive and the voltage Vso produced from the voltage signal supply circuit 79 is applied through the control transistor 74 to the output terminal A0 of the inverter, i.e. the source of the load transistor 72. At this time, the voltage Vso is rises in the voltage signal supply circuit 79 until the power source voltage Vc is supplied through the MOS transistors 80 and 81, and the MOS transistor 81 is cut off. Following the cut-off of the transistor 81, the gate voltage of the MOS transistor 82 abruptly rises. Accordingly, the MOS transistor 82 is in an ON state, and the voltage Vso is kept constant dependent on a conductive resistance ratio of the transistors 80 to 82. The voltage Vso is applied through the load transistor 72 to the source of the control transistor 71, so that the gate potential of the control transistor 71 supplied with the signal $\overline{PD}$ equivalently becomes negative.

In the negative condition of the threshold voltage Vth71 of the control transistor 71, the control transistor 71 is reliably cut off. At this time, the signal ai is kept below the threshold voltage of the transistor 73. More specifically, the MOS transistor 81 of the voltage signal supply circuit 79 has the same threshold voltage Vth81 as that of the control transistor 71. The voltage Vso produced at the source approximates to the absolute value |Vth81| of the threshold voltage $Vth_{81}$ when the gate voltage is "0" V.

The transistor 82 is of the enhancement type with the same threshold voltage as that of the transistor 73, for example. The transistor 80, which is of the depletion type in this embodiment, may be substituted by a mere resistive element. The voltage Vso supplied to the source of the control transistor 71 is always larger than the gate potential (the signal $\overline{PD}$). Accordingly, the gate potential is equivalently negative and the voltage Vso is produced changing dependent on the threshold voltage Vth71 of the control transistor 71. Therefore, the setting of the threshold voltage Vth71 is relatively easy. The voltage Vso is preferably less than the threshold voltage Vth77 of the drive MOS transistor 77. When the power down mode terminates, that is to say, the integrated circuit operates (the power down signals $\overline{PD}$ and PD are "1" and "0", respectively), the threshold voltage Vth71 of the control transistor 71 is negative. Accordingly, when the output signal of the inverter is at "1" level, the voltage rises up to the power source voltage Vc, thereby to prevent the reduction of the power source margin.

The gate of the MOS transistor 81, not connected to ground, may be gatecontrolled by the power down mode signal $\overline{PD}$. In the integrated circuit shown in FIG. 18, also in the circuit forming the poststage inverter, i.e. the circuit comprised of the MOS transistors 75 to 78, the operation is substantially the same as that of the inverter as mentioned above. Accordingly, the explanation of its operation will be omitted.

In a modified version of the voltage signal supply circuit 79, the transistor 80 is removed; the drain of the transistor 81 is connected to the power source voltage $V_c$; the gate of the transistor 82 is connected to the drain of the transistor 82, i.e. the source of the transistor 81. In this case, in the power down mode, the voltage Vso is produced from the drain of the transistor 82. The voltage Vso is |Vth81| when the absolute value |Vth81| of the threshold voltage Vth81 of the transistor 81 is smaller than the threshold voltage Vth82 of the transistor 82. The transistors 71, 75 and 81 are turned off and the current consumption is zero. Even if |Vth81| is larger than Vth82, the voltage Vso is never below the Vth82. Accordingly, the current consumption is very small.

A signal with a higher level than that of the signal $\overline{PD}$ may be supplied to the gate of the transistor 81 of the voltage signal supply circuit 79. In this case, the voltage Vso goes high to reliably shut off the current flowing into the control transistors 71 and 75. In this way, the sure power saving is attained.

Figure 19:
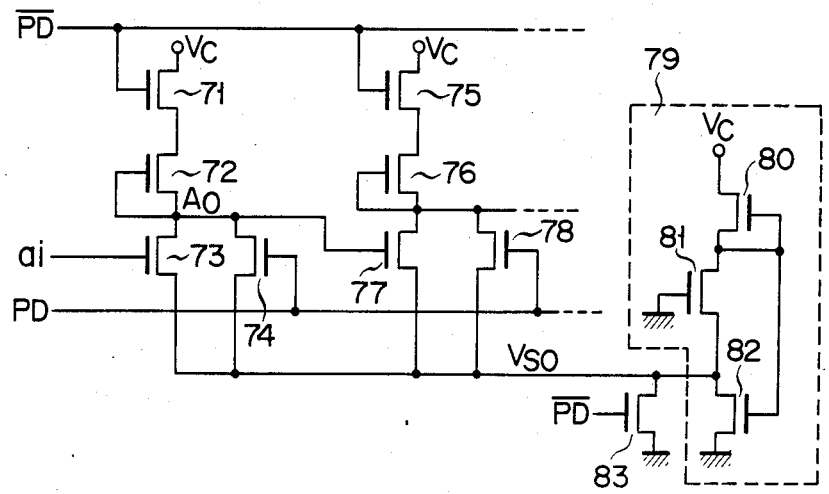
FIG. 19 shows another embodiment of the device shown in FIG. 18.

FIG. 19 shows a modification of the embodiment shown in FIG. 18. In this modification, the drive transistors 73 and 77 and the control transistors 74 and 78 are connected to the ground through the MOS transistor 83. The MOS transistor 83 is gate-controlled by the power down mode signal $\overline{PD}$. When the signal $\overline{PD}$ is "0", the transistor 83 is cut off and the voltage Vso from the voltage signal supply circuit 79 is applied to the control transistors 74 and 78. When the power down mode is removed, i.e., when the signal $\overline{PD}$ is "1", the MOS transistor 83 is in an ON state, the voltage Vso is kept at ground level. This arrangement has the useful effects like the embodiment shown in FIG. 18. The remaining contruction and operation are similar to those of the FIG. 18 embodiment. No further explanation of them will be given, with mere notations of like numerals for like portions in FIG. 18.

Figure 20:
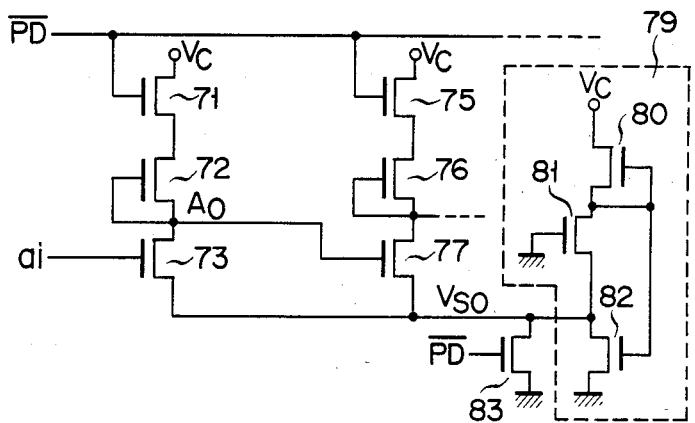
FIG. 20 shows still another embodiment of the device shown in FIG. 18.

In FIG. 20, the control transistors 74 and 78 gatecontrolled by the power down mode signal PD in FIG. 19 are omitted. The effects obtained by this embodiment are comparable with those by the FIG. 19 embodiment. In a power down mode, the supply of the power source voltage $V_c$ can be completely stopped by the control transistors 71 and 75, so that the potentials at the respective circuit points rise slightly and the substrate potential little changes when the power down mode is removed. The remaining circuit construction and operation are similar to those of the previous related embodiment.

Figure 21:
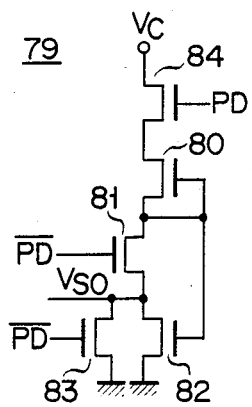
FIGS. 21 and 22 are circuit diagrams of voltage signal supply circuits in the embodiments shown in FIGS. 18 to 20.
Figure 22:
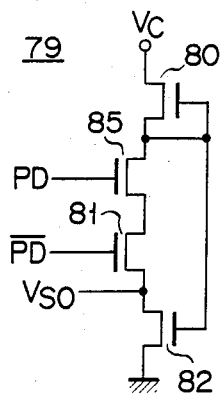

FIGS. 21 and 22 illustrate other embodiments of the voltage signal supply circuit 79 for producing the voltage Vso used in the embodiments of FIGS. 18, 19 and 20. In FIG. 21, the power source voltage Vc is supplied, not directly but through the a MOS transistor 84 of the n-channel enhancement type, for example, to the drain of the MOS transistor 80. The MOS transistor 84 is gatecontrolled by the power down mode signal PD. When the signal PD is "0" when the power down mode is removed, the MOS transistor 84 is cut off, so that the power consumption in the voltage signal supply circuit 79 is prevented in a normal operation mode.

In FIG. 22, the power source voltage $V_c$ supplied from the source of the MOS transistor 80 is supplied to the drain of the MOS transistor 81, through the MOS transistor 85 of an n-channel enhancement type, for example. In this embodiment, the MOS transistor 85 is gate-controlled by the power down mode signal PD so that the MOS transistor 85 is cut off when the signal PD is "0" at the time of removing the power down mode. In FIGS. 21 and 22, the MOS transisor 81 is gate-controlled by the power down mode signal $\overline{PD}$. In the arrangement, when the potential of the signal $\overline{PD}$ rises, the potential of the voltage Vso may correspondingly be raised.

The signal applied to the gate of the transistor 81 in the voltage signal supply circuit 79 in FIG. 18 may of course be the signal $\overline{PD}$. Therefore, the control transistor 71 can reliably be cut off even when the signal $\overline{PD}$ rises in the power down mode. The remaining circuit construction and the operation of the arrangement will readily be understood when reading the embodiments of FIGS. 18 to 20.

Figure 23:
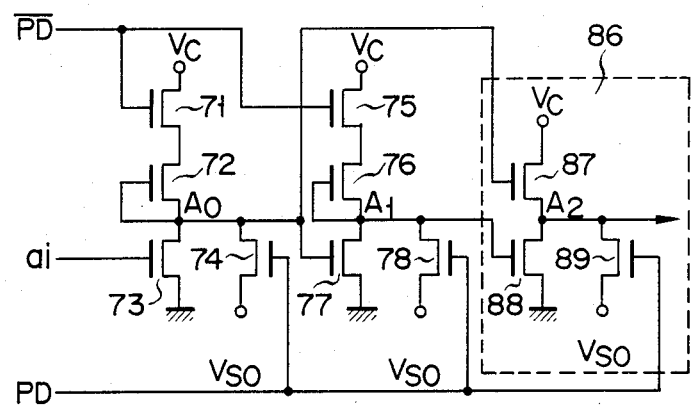
FIG. 23 shows an embodiment when a semiconductor integrated circuit device according to the present invention is applied to a buffer circuit.

FIG. 23 shows an arrangement when the present invention is applied to a buffer circuit. The arrangement corresponds to the FIG. 18 embodiment (except the voltage signal applying circuit 79) additionally having a buffer circuit 86. In the buffer circuit 86, a load and control MOS transistor 87 and a drive MOS transistor 88 are connected in series between the power source voltage $V_c$ and ground potential. The MOS transistors 87 and 88 are gate-controlled by signals from the output terminals A0 and A1 of inverter, respectively. The voltage Vso is supplied through a control transistor 89 to the output terminal A2 as the junction point between the MOS transistors 87 and 88. The control transistor 89 is of the n-channel enhancement type and is gate-controlled by the power down mode signal PD.

Also in the integrated circuit with the buffer circuit 86, the control transistor 89 is conductive when the signal PD is "1" in a power down mode, and the voltage Vso is supplied to the output terminal A2. Accordingly, when the source potential of the MOS transistor 87 rises, the MOS transistor 87 with a negative threshold voltage is substantially cut off, reducing the power consumption. At the time of removing the power down mode, the signal PD is "0" causes the control transistor 89 to be cut off, to allow a normal operation of the buffer circuit 86.

Figure 24:
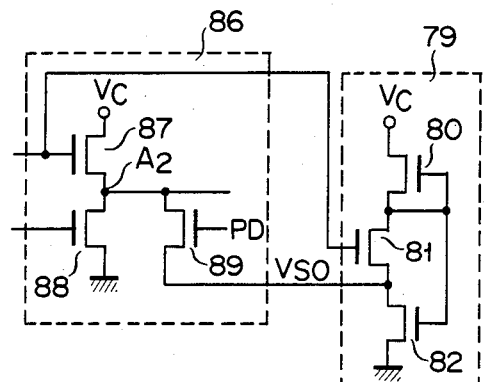
FIGS. 24 and 25 show other embodiments of the circuit shown in FIG. 23.
Figure 25:
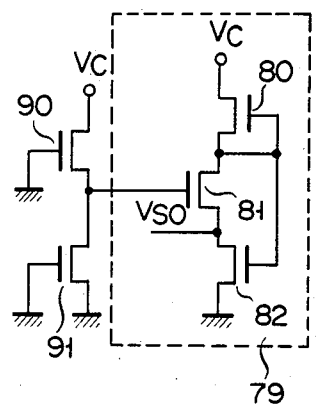

In each of FIGS. 24 and 25, a circuit with the buffer circuit 86 shown in FIG. 23 has a voltage signal supply circuit 79 for applying the voltage Vso to the output terminal A2 of the buffer circuit 89, through a MOS transistor 89 in a power down mode. As shown in FIG. 24, the MOS transistor 81 in the voltage signal supply circuit 79 is gate-controlled by the gate signal of the MOS transistor 87 of the buffer circuit 86. With this arrangement, the voltage Vso can be produced in accordance with the gate potential of the MOS transistor 87. Even when the gate potential of the MOS transistor 87 is relatively high, the MOS transistor 87 can reliably be cut off in a power down mode. In an embodiment shown in FIG. 25, the source voltage of the MOS transistor 90 with the same negative threshold voltage as that of the MOS transistor 87 of the buffer circuit 86 is applied to the gate of the MOS transistor 81 in the voltage signal supply circuit 79. The transistor 90 is supplied at the drain with the power source VC and grounded at the gate, and grounded at the source through the MOS transistor 91 with a negative threshold voltage like the MOS transistor 90. The transistor 91 is provided to provide a discharge path when the source potential Vso of the transistor 90 abnormally rises due to noise or the like. The conductive resistance of the transistor 91 is much higher than that of the transistor 90. The voltage signal supply circuit 79 thus constructed can reliably produce a voltage Vso determined by the sum of the absolute value of the threshold voltage of the MOS transistor 87 and the gate voltage thereof. By applying the voltage Vso to the source of the MOS transistor 87 in a power down mode, the MOS transistor 87 can reliably be cut off.

Figure 26:
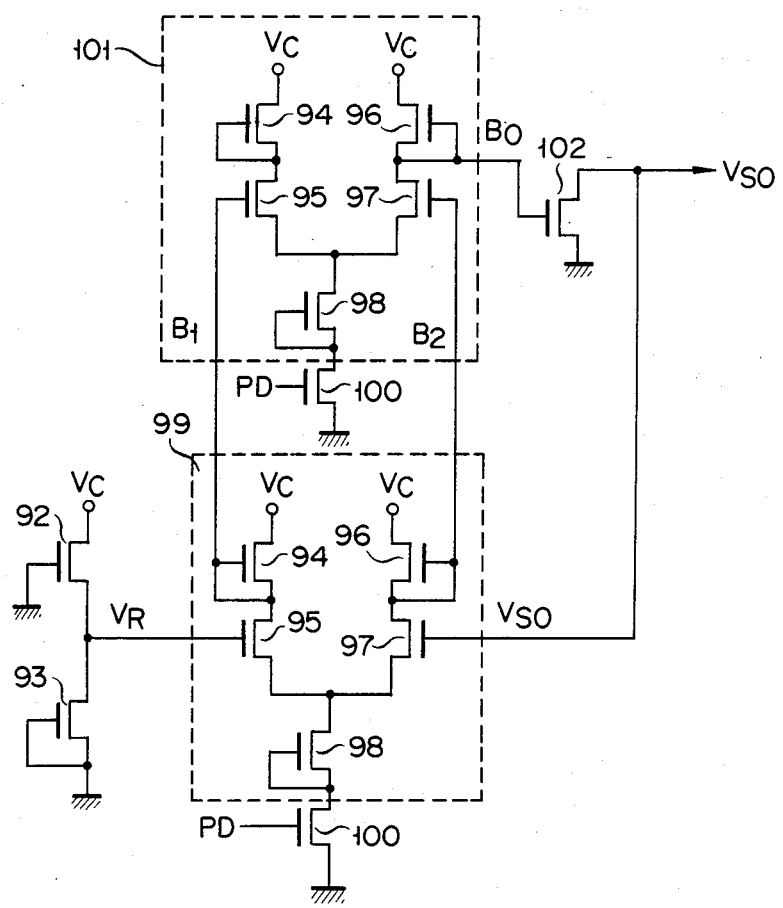
FIG. 26 shows another embodiment when a semiconductor integrated circuit device of the invention is applied to an integrated circuit with a power down function.

FIG. 26 illustrates another embodiment of a voltage signal supply circuit for producing the voltage Vso. The voltage signal supply circuit is provided with a MOS transistor 92 with the same negative threshold voltage as that of the control transistor 71 in the circuit shown in FIG. 18. The power source voltage $V_c$ is supplied to the drain of the MOS transistor 92 connected at the gate to ground. The source of the MOS transistor 92 is grounded through a MOS transistor 93 of depletion type and produces at the source a voltage $V_R$ in accordance with the negative threshold voltage. The voltage $V_R$ is applied to one of the input terminals of a known differential amplifier 99 composed of MOS transistors 94 to 98. The other input terminal of the amplifier 99 is connected to the source of the control transistor 74 shown in FIG. 18, and is supplied with the voltage Vso. A MOS transistor 100, provided between the differential amplifier 99 and ground, is gate-controlled by the power down mode signal PD. A differential amplifier 101 like the differential amplifier 99 is supplied at one input terminal with an output signal B1 of the amplifier 99 and at the other input terminal with another output signal B2 from the amplifier 99. The output signal B0 of the amplifier 101 is supplied to the gate of the MOS transistor 102 and the drain of the transistor 102 is connected to the other input terminal of the amplifier 99 and its source is grounded. The gate of the MOS transistor 92 is not grounded and controlled by the power down mode signal $\overline{PD}$.

Let us consider a case where the voltage signal supply circuit thus constructed is applied for the integrated circuit shown in FIG. 18. In a power down mode, the signals $\overline{PD}$ and PD are "0" and "1", respectively. When the potential at the source of the control transistor 71, i.e, the voltage Vso, is higher than that voltage $V_R$, the output signals B1 and B2 from the amplifier circuit 99 are "1" and "0", respectively. Accordingly, the output signal B0 of the amplifier circuit 101 is "1" in level and the MOS transistor 102 is low in resistance. The voltage Vso drops through a current path between the MOS transistor 102 and ground. When the voltage Vso is lower than the voltage $V_R$, the output signals B1 and B2 from the amplifier circuit 99 are "0" and "1", respectively. The output signal B0 from the amplifier circuit 101 is "0" in level, the MOS transistor 102 is high in resistance and the voltage Vso rises. According to the voltage signal supply circuit, the voltage Vso can always be adjusted in accordance with the threshold voltage of the control transistor 71 in the integrated circuit. Accordingly, a proper voltage Vso can be obtained and particularly in a power down mode, the control transistor 71 can reliably be cut off. The amplifiers 99 and 101 of course operate in accordance with the power down mode signal PD.

In the embodiments shown in FIGS. 18 to 20, the voltage Vso is supplied to the sources of the load MOS transistors 72 and 76 in a power down mode. Alternatively, the voltage Vso may directly be applied to the sources of the control MOS transistors 71 and 75. This invention is also applicable to a case where the control transistors 71, 75, 81, 87 and 90 are MOS transistors of the p-channel depletion type having a positive threshold voltage, and the control transistors 74, 78, 84, 88 and 89 are MOS transistors of the p-channel enchancement type. In the p-channel integrated circuit, when the power source $V_c$ is negative, the logic "1" of the power down signal PD is equal to the $V_c$ potential.

In the embodiments shown in FIGS. 18 to 26, the supply of the power source to a MOS transistor circuit forming a logic circuit is controlled in a power down mode, thereby to stabilize the operation of the control MOS transistor of the depletion type. With this arrangement, the power consumption is reliably reduced and a satisfactory power source margin can be secured in a normal circuit operation.

Figure 27:
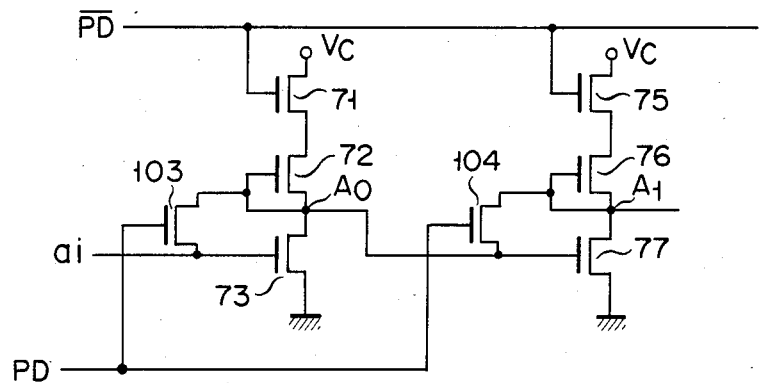
FIG. 27 shows a modification of the embodiment shown in FIG. 26.

FIG. 27 illustrates a further embodiment of a semiconductor integrated circuit according to the present invention. The major differences of this embodiment from the FIG. 18 embodiment are as follows. The MOS transistors 74 and 78 are removed. No voltage signal supply circuit 79 is provided. A MOS transistor 103 is provided between the gates of MOS transistors 72 and 73. A MOS transistor 104 is provided between the gates of MOS transistors 76 and 77. The power down mode signal PD is applied to the gates of the MOS transistors 103 and 104.

In the arrangement shown in FIG. 27, the power down signals PD and $\overline{PD}$ shown in FIG. 27 are "1" and "0", respectively, in a power down mode. Accordingly, in this mode, the drain and source of the drive transistors 103 and 104 are electrically interconnected with each other. It is assumed that the threshold voltages Vth71 and Vth75 of the control transistors 71 and 75 are negative and that the absolute values $|Vth71|$ and $|Vth75'|$ are smaller than the threshold values Vth73 and Vth77 of the drive transistors 73 and 77. The potentials at the drains of the drive transistors 73 and 77 constituting output terminals A0 and A1 rise up to the potentials of $|Vth71|$ and $|Vth75|$. This is seen from the following relation "Vs=$V_G$−Vth" where Vs is the potential appearing at the sources of the transistors 71 and 75 and VG is the gate voltage of each of the control transistors 71 and 75, which is "0" V ($\overline{PD}$) in this example. The drive transistors 73 and 77 are interconnected at the drain and the source, as described above. Therefore, the gate potentials of the transistors 73 and 77 are $|Vth71|$ and $|Vth75|$ respectively. The gate potentials $|Vth71|$ and $|Vth75|$ are smaller than the threshold voltages Vth73 and Vth77 of the drive transistors 73 and 77, respectively. Under this condition, the drive transistors 73 and 77 are in an OFF state. Accordingly, the power current consumption in the circuit composed of the MOS transistors 71 to 73 and 75 to 78 is substantially only the leakage current at the PN junction and the like, and therefore is remarkbly reduced.

When the threshold voltages $|Vth71|$ and $|Vth75|$ of the control transistors 71 and 75 are larger than the threshold voltages Vth73 and Vth77, the drive transistors 73 and 77 are conductive. Currents proportional to a difference between the threshold voltage Vth73 and the gate potential and between the threshold voltage Vth77 and the gate potential flow through the transistors, respectively. The potentials at the output terminals A0 and A1, i.e., source potentials of the transistors 71 and 75 are kept higher than the threshold voltages Vth73 and Vth77 of the drive transistors. Therefore, when the threshold voltages of the transistors 71 and 75 are made equal to each other, the current consumption is very small. The reason for this is that the gate potentials of the control transistors 71 and 75 are equivalently negative as seen from the source sides of the transistors, with the result that the current is restricted low.

In a power down mode, the voltages at the output terminals A0 and A1 change in accordance with the threshold voltages of the control transistors 71 and 75. Accordingly, if the threshold voltages of the control transistors 71 and 75 varies, the power source current never increases. When the power down mode is removed, i.e. the signals PD and $\overline{PD}$ are "0" and "1", respectively, the control transistors 103 and 104 are cut off, so that the drain and gate of the drive transistors 73 and 77 are disconnected. Further, the control transistors 71 and 75 are ON and the power source current is fed to the output terminals A0 and A1. At this time, the threshold voltages Vth71 and Vth75 of the control transistors 71 and 75 are negative.

The output signals corresponding to the voltage corresponding to the power source voltage $V_c$ appear at the output terminals A0 and A1 in accordance with the operations of the drive transistors 73 and 77, so as not to reduce the power source margin. The threshold voltages $|Vth71|$ and $|Vth75|$ of the control transistors 71 and 75 are, e.g., near 0 V and smaller than the absolute values $|Vth72|$ and $|Vth76|$ of the threshold voltages of the load MOS transistors 72 and 76 of the n-channel depletion type, respectively.

Figure 28:
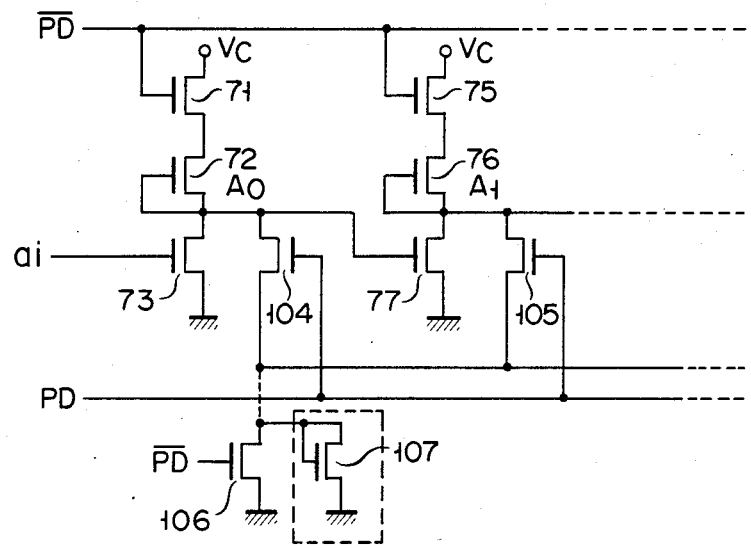
FIGS. 28 to 30 show other modifications of the embodiment shown in FIG. 26.

In an arrangement shown in FIG. 28, the control transistors 102 and 103 in FIG. 27 are replaced by the control MOS transistors 104 and 105 and are connected in series between the output terminal A0 of the prestage MOS transistor and the output terminal A1 of the poststage MOS transistor. These control transistors 104 and 105 are conductive when the power down mode signal PD is "1". In the circuit, when the signals PD and $\overline{PD}$ respectively are "1" and "0", i.e., in a power down mode, the control transistors 104 and 105 are conductive and the output terminals A0 and A1 are electrically interconnected. Accordingly, the gate and drain of the drive transistors 77 in the poststage MOS transistor circuit are interconnected. Therefore, the threshold voltages Vth71 and Vth75 of the control transistors 71 and 75 are negative, as in the FIG. 27 embodiment, and when the absolute values |Vth71| and |Vth75| are smaller than that Vth77 of the drive transistor 77, the drive transistor 77 is nonconductive, resulting in great reduction of the current consumption. Even when these absolute values are larger than Vth77, the current consumption may be made small, compared with the conventional one.

When the signals PD and $\overline{PD}$ are "0" and "1", respectively, i.e., when the power down mode is removed, since the threshold voltages Vth71 and Vth75 of the control transistors 71 and 75 are negative, an output signal substantially corresponding to the power source voltage $V_c$ can be obtained in accordance with the operations of the drive transistors 73 and 77, without reducing the power source margin, as in the FIG. 27 embodiment.

In the above-mentioned operation, for preventing the source of the control transistor 104 from being in a floating state, the source of the transistor is connected to the ground through the MOS transistor 106 gate-controlled by the signal $\overline{PD}$ or through the MOS transistor 107 of which the drain and the gate are interconnected. In this case, one MOS transistor 107 is provided connected to the sources of the transistors 104 and 105, as shown in FIG. 28, or two transistors 107 may be provided connected to the same sources, respectively. In the latter case, there is no need of the connection of the sources of the transistors 104 and 105, unlike the case of FIG. 29.

In a power down mode, the transistors 104 and 105 are conductive and the sources of the transistors 71 and 72 are coupled with the drain of the transistor 107, which serve like the transistor 77, so that the current consumption in a power down mode is greatly reduced. The channel width and the channel length of the transistor 107 may both be small. One transistor 107 provided for both the transistors 104 and 105 is preferable because the chip area may be saved. However, the two transistors 107 provided for those transitors is preferable when a wiring layer for interconnecting the sources of the transistors 104 and 105, as shown in FIG. 28, the pattern layout needs two transistors 107, or the formation of the single transistor increases its pattern occupying area.

Metal such as aluminum is preferable for wiring the source connection of the transistors 104 and 105. A single metal layer is required for the provision of the source connection line. The transistor 107 may be formed under the aluminum layer, for example. Accordingly, there is a case that the smaller pattern occupying area is obtained with the sources of the transistors 104 and 107 are commonly connected and the transistor 107 are provided for the transistors 104 and 105.

Figure 29:
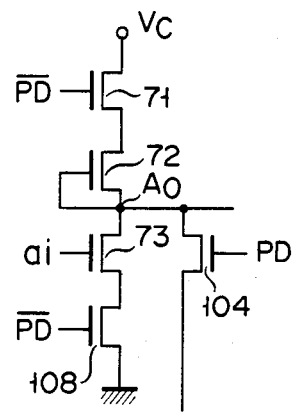

In an integrated circuit shown in FIG. 29, the output terminal A0 of the prestage MOS transistor circuit is coupled with the output terminal A1 of the poststage MOS transistor circuit in a power down mode, thereby to connect the drain transistor 77 with the gate thereof, as in the FIG. 28 embodiment. Also in the integrated circuit, the source of the drive transistor 73 in the prestage MOS transistor circuit is grounded through a control MOS transistor 108 gate-controlled by the signal $\overline{PD}$.

In the integrated circuit, when the circuit is in a power down mode, the power source current may greatly be saved like the embodiment of FIG. 29. The prestage MOS transistor circuit shown in FIG. 29 can save the power source current for the reason that the control transistor 108 is nonconductive when the signal $\overline{PD}$ is "0". Thus, the power source current in the overall integrated circuit may greatly be saved, as compared with the FIG. 28 embodiment. The effect when the power down mode is removed is the same as that of the FIG. 28 embodiment. The circuit of FIG. 29 is best suited for the first stage in the integrated circuit to which the signal ai is externally applied. Even when the input signal ai is logic "1" in a power down mode, no current flows thereinto since the transistor 108 cut off.

Figure 30:
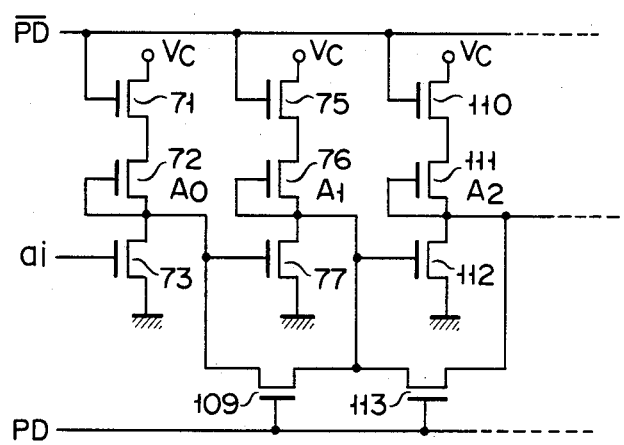

In an arrangement shown in FIG. 30, the connection of the output terminal A0 of the prestage MOS transistor circuit with the output terminal A1 of the poststage MOS transistor is made by only the control MOS transistor 109 in place of the control MOS transistors 104 and 105. Similarly, the output terminal A1 and the output terminal A2 of the succeeding stage MOS transistor circuit, i.e. the circuit made up of the MOS transistors 110 to 112 are connected by means of the control MOS transistor 113. The control MOS transistor 109 and 113 are gatecontrolled by the power down mode signal PD and is conductive when the signal PD is "1". Also in this integrated circuit, when the circuit is in a power down mode, i.e. the signals PD and $\overline{PD}$ are "1" and "0", the drive transistors 57 and 112, except the drive transistor 73, in the first stage MOS transistor circuit are connected at the gate and drain. Accordingly, also in this case, the current consumption can be saved in a power down mode. The circuit and operation of the embodiment is similar to those in FIG. 28 and hence no explanation thereof will be given.

In the embodiments shown in FIGS. 27 to 30, the control transistors 71, 75 and 110 may be replaced by p-channel depletion type MOS transistors with positive threshold voltage, and the control transistors 103 to 105 and 108, 109 and 113 may be substituted by the p-channel enhancement type MOS transistors. In this modification, the power source $V_c$ is $-5$ V and the signal PD is $-5$ V for logical "1".

According to the arrangement shown in FIGS. 27 to 30, in the circuit composed of MOS transistors, the power supply is controlled by the depletion type MOS transistor in accordance with the power down mode signal. The means is provided for connecting the drain and the gate of the drive MOS transistor supplied with power from the depletion type MOS transistor. With this arrangement, the saving of the power current consumption is ensured, and a satisfactory power margin is secured in a normal circuit operation.

Figure 31:
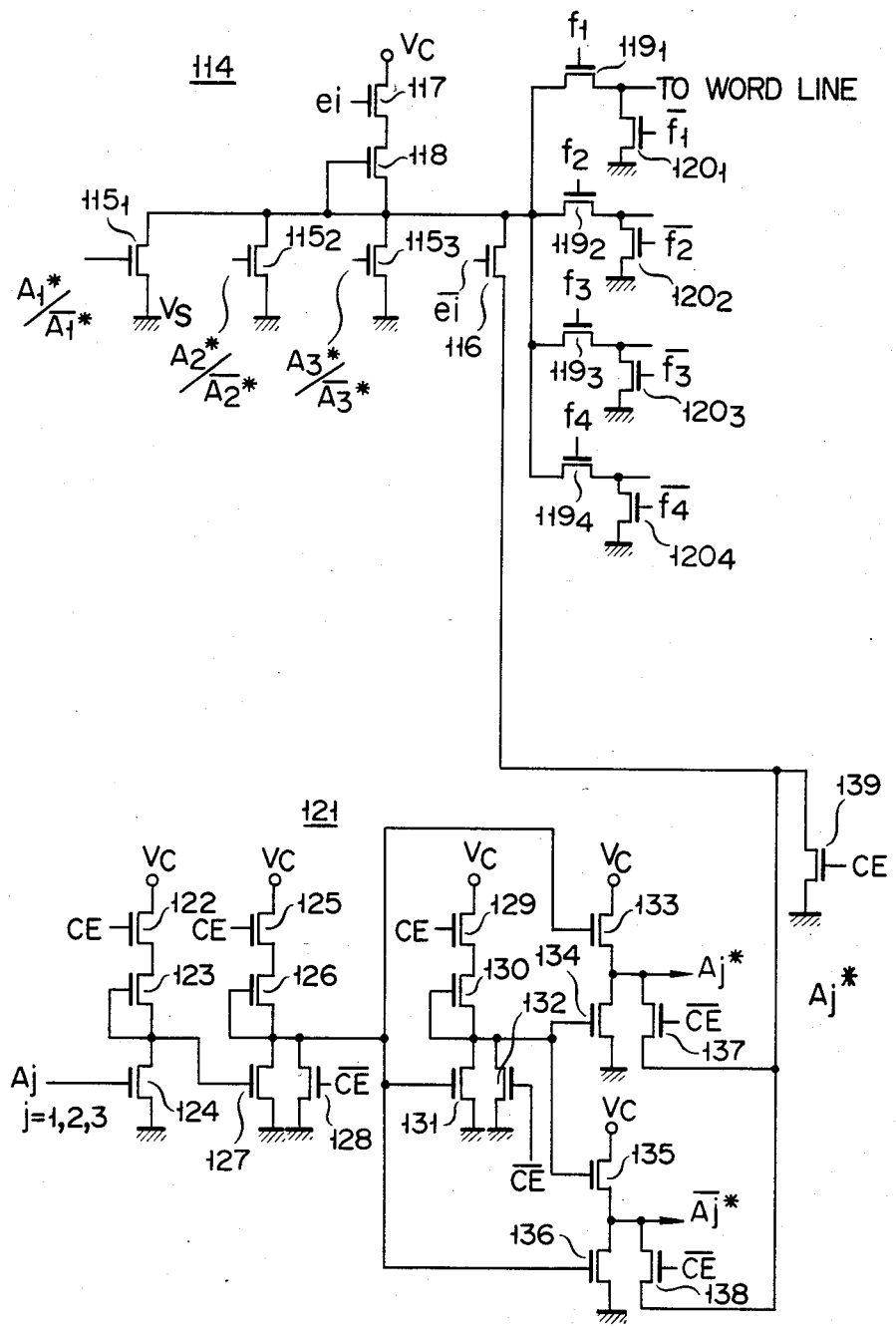
FIG. 31 shows an embodiment when an integrated circuit device according to the present invention is assembled into a decoder.

FIG. 31 illustrates an embodiment when the semiconductor integrated circuit device according to the present invention is applied for a decoder.

In this embodiment, a main decoder 114 is composed of a plurality of enhancement type MOS transistors $115_1$ to $115_3$ for receiving at the gates selection signals, and enhancement type MOS transistor 116 connected between the transistors $115_1$ to $115_3$ and an address buffer 121 to be given later, depletion type MOS transistors 117 and 118 connected in series between the drains commonly connected of the MOS transistors $115_1$ to $115_3$ and the power source voltage $V_c$, a plurality of enhancement type MOS transistors $119_1$ to $119_4$ connected in parallel between the drains commonly connected of the MOS transistors $115_1$ to $115_3$ and the word line of the memory (not shown), and a plurality of enhancement type MOS transistors $120_1$ to $120_4$ connected to the terminals of the transistors $119_1$ to $119_4$. The gate and drain of the MOS transistors 118 are interconnected.

An address buffer 121 is connected to the main decoder 114 thus constructed. The address buffer 121 is composed of a first series circuit including depletion type MOS transistors 122, 123 and an enhancement type transistor 124 connected in series across the power source (power source $V_c$ and ground ($V_s$)), a second series circuit including depletion type MOS transistors 125, 126 and an enhancement type MOS transistor 127 connected across the power source, a third series circuit including depletion type MOS transistors 129, 130 and an enhancement type MOS transistor 131 connected across the power source, an enhancement type MOS transistor 128 connected in parallel with the MOS transistor 127, an enhancement type MOS transistor 132 connected in parallel with the MOS transistor 131, a fourth series circuit including a depletion type MOS transistor 133 and an enhancement type MOS transistor 134 across the power source, a fifth series circuit including a depletion type MOS transistor 135 and an enhancement type MOS transistor 136, an enhancement type MOS transistor 137 connected in parallel with the transistor 134, an enhancement type MOS transistor 138 connected in parallel with the transistor 136, and an enhancement type MOS transistor 139 which is connected at the drain to the sources of the transistors 137 and 138. The gate and source of the transistor 123 is interconnected and its connection point is connected to the gate of the transistor 127. Similarly, the gate and source of the transistor 126 are interconnected and its connection point is connected to the gates of the transistors 131, 133 and 136. The sources of the transistors 137 and 138 are connected to the source of the MOS transistor 116 in the main decoder 114.

With such a construction, signals A1*/$\overline{A1}$, A2*/$\overline{A2}$ and A3*/$\overline{A3}$ are applied to the gates of the MOS transistors $115_1$ to $115_3$ in the main decoder 114. Signals ei and $\overline{ei}$ are applied to the MOS transistors 117 and 116, respectively. Signals f1 to f4 are applied to the gates of the MOS transistors $119_1$ to $119_4$, respectively; signals $\overline{f1}$ to $\overline{f4}$ to the gates of the MOS transistors $120_1$ to $120_4$, respectively.

A chip enable signal CE (equivalent to the signal PD) is applied to the MOS transistors 122, 125, 129, and 139 in the address buffer 121. The signal $\overline{CE}$ which is out of phase with respect to the signal CE, is applied to the gates of the MOS transistors 128, 132, 137, and 138.

In a power down mode, the signal ei applied to the transistor 117 and the signal $\overline{ei}$ to the gate of the transistor 116 are "0" and "1", respectively. The transistor 117 is turned off to shut off the supplying of the power source voltage $V_c$. At the same time, the potentials at the sources of the MOS transistors 137 and 138 in the address decoder are applied through the MOS transistor 116 in the main decoder 114 to the source of the transistors 117, 118, thereby to raise the source potential of the transistor 117 higher than the gate potential thereof. The present embodiment can attain substantially the same effects as those of the embodiments in FIGS. 18 to 30. The depletion type transistors 117, 122, 125, 127, 133 and 135 have each a threshold voltage which is negative and close to 0 V.

Figure 32:
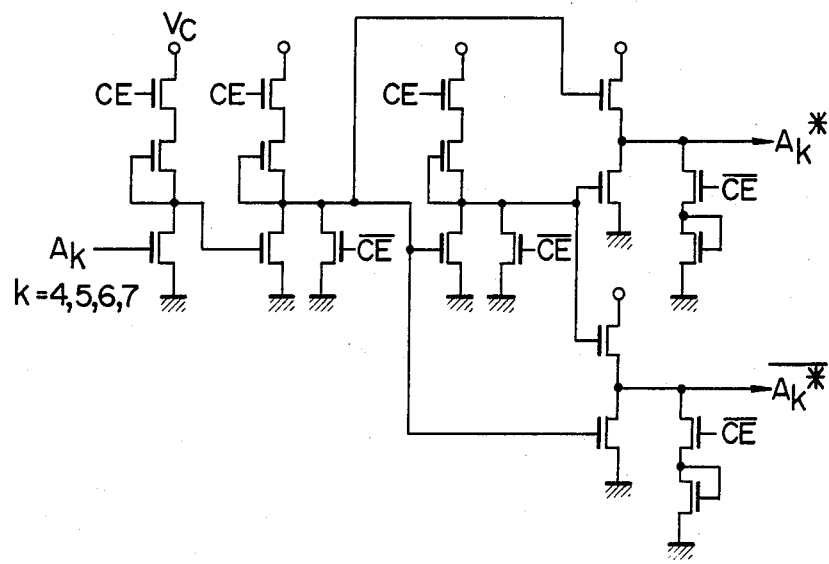
FIGS. 32, 33 and 34 illustrate decoders for producing various signals applied to the decoder shown in FIG. 31.
Figure 33:
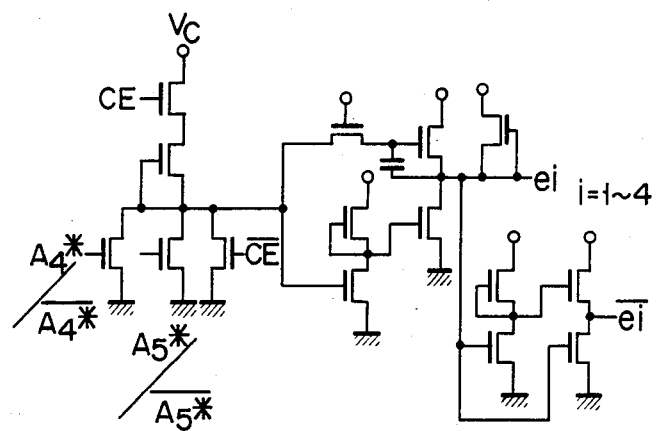
Figure 34:
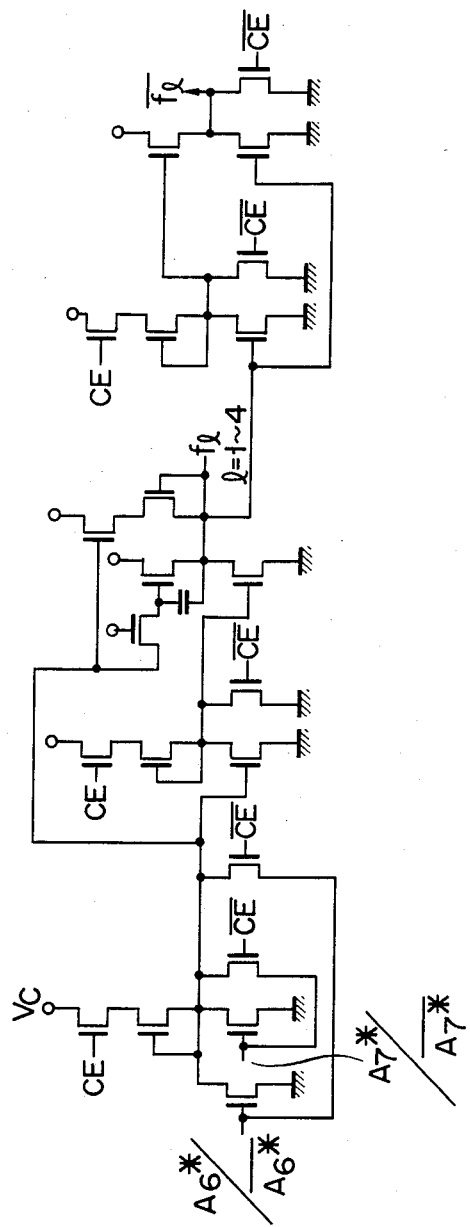

FIG. 32 illustrates an address buffer for producing selection signals (address data) Ak* and $\overline{Ak}$ applied to the decoders of FIGS. 33 and 34. FIG. 33 illustrates a decoder for producing signals ei and $\overline{ei}$ applied to the gates of the MOS transistors 117 and 116 in the main decoder 114. FIG. 34 illustrates a decoder for producing signals f1–f4, $\overline{f1}$–$\overline{f4}$ applied to the gates of the transistors $119_1$ to $119_4$ and $120_1$ to $120_4$ in the main decoder 114.

This invention is not limited to the above embodiments disclosed herein. The voltage signal supply circuit 79 in FIG. 18 may be used in place of the circuit in FIG. 8 comprising the amplifiers 10 and 20 for producing the potential V2 at the circuit point 2 or vice versa. When the voltage signal supply circuit 79 is used in place of the circuit comprising the amplifiers 10 and 20 in FIG. 8, the source potential $V_s$ of the transistor 9 in FIG. 8 is supplied to the gate of the transistor 81. In this case, the threshold voltage of the transistor 81 is set at 0 V. The potential V2 is supplied from the junction of the transistors 81 and 82 in the circuit 79. Further, the transistor 81 in the circuit 79 may be replaced by the transistor 9 of FIG. 8. In this case, the potential V8 is applied to the gate of the transistor 9 as in the embodiment of FIG. 8. The potential V2 is given from the junction of the transistors 81 and 82. In these cases, like above embodiments, the potential V2 at the circuit point 2 changes in accordance with a potential at the source side of the transistor 79.

It should be understood that the present invention may variously be modified and changed within the the scope of the present invention.

What we claim is:

1. A semiconductor integrated circuit device comprising:
   a high potential power source;
   a low potential power source;
   a circuit for applying an intermediate potential between high and low potentials of said power sources to a circuit point, said intermediate potential applying circuit including a first MOS transistor connected at one end of its drain-source path to said high potential power source and having a predetermined voltage signal at its gate, a first differential amplifier circuit for receiving at one of the input terminals a voltage signal at the other end of said first MOS drain-source path and at another input terminal a voltage signal at said circuit point, a second differential amplifier for receiving at one of the input terminals a first output signal of said first differential amplifier circuit, and an MOS transistor connected between said circuit point and said low potential power source and receiving at its gate the output signal from said second amplifier circuit; and a logic circuit connected to said high potential power source and said circuit point and operating in a voltage range betweeh the potentials of said high potential power source and at said circuit point.

2. A semiconductor integrated circuit device according to claim 27, wherein said intermediate potential applying circuit includes a first MOS transistor connected at one end of its drain-source path to said high potential power source and having a predetermined voltage signal at its gate, a first differential amplifier circuit for receiving at one of the input terminals a voltage signal at the other end of said first MOS transistor drain-source path and at another input terminal a voltage signal at said circuit point, a second differential amplifier for receiving at one of the input terminals a first output signal of said first differential amplifier circuit, and at another input terminal a second output signal from said first differential amplifier circuit, and an MOS transistor connected between said circuit point and said low potential power source and coupled at the gate with the output signal from said second amplifier circuit.

3. A semiconductor integrated circuit device according to claim 27, wherein said intermediate potential applying circuit includes a first MOS transistor connected at one end of its drain-source path to said high potential power source and having its gate connected to a predetermined voltage, a differential amplifier circuit connected at one of the input terminals to a voltage signal at the other end of the drain-source path of said first MOS transistor and at another input terminal a voltage at said circuit point, an intermediate amplifier circuit for receiving an output signal from said differential amplifier circuit, and an MOS transistor for receiving at the gate an output signal from said intermediate amplifier circuit, of which the drain-source path is connected between said circuit point and said low potential power source.

4. A semiconductor memory device comprising
a plurality of column lines;
a plurality of row lines crossing said column lines;
memory cells each including an MOS transistor disposed at cross points of said column lines and said row lines, the drain of each MOS transistor being connected to a corresponding column line; and
means connected between a high potential power source and a low potential power source for applying a signal at a given potential between high and low potentials of said power source to the source of said MOS transistor constituting each memory cell, said signal applying means comprising a transistor circuit including a transistor equivalent to said MOS transistor constituting said memory cell, means for applying a signal, which is at a potential substantially equal to the potential on a nonselected row line, to the gate of said equivalent MOS transistor, and means for fetching an output signal from said equivalent transistor and supplying the output signal to the source-drain path of the MOS transistors in said memory cells.

5. A semiconductor integrated circuit device comprising:
a control MOS transistor of the depletion type gate-controlled by a first input signal;
a drive MOS transistor supplied with a power source voltage through said control MOS transistor and gatecontrolled by a second input signal; and
means for connecting the drain and gate of said drive MOS transistor in a power down mode.

6. A semiconductor integrated circuit device according to claim 5, wherein a load circuit is provided between said control MOS transistor and said drive MOS transistor.

7. A semiconductor integrated circuit according to claim 6, wherein said load circuit is a depletion type MOS transistor and an absolute value of a threshold voltage of each of said depletion type MOS transistors is higher than an absolute value of a threshold voltage of each of said control MOS transistors.

8. A semiconductor integrated circuit device comprising:
a circuit including a plurality of MOS transistor circuits, including at least a prestage and a post-stage, each said circuit being made up of a control MOS transistor of the depletion type gate-controlled by a first input signal and drive MOS transistor supplied with a power source voltage through said control MOS transistor;
a connection line for connecting the drain of said drive MOS transistor of the prestage with the gate of said drive MOS transistor of the post-stage;
first means for interconnecting the drain and the gate of said drive MOS transistor of the respective stages except the prestage; and
second means for shutting off the source current of said drive MOS transistor of the first stage in a power down mode.

9. A semiconductor integrated circuit device according to claim 8, wherein a load circuit is provided between said control MOS transistor and said drive MOS transistor.

10. A semiconductor integrated circuit according to claim 9, wherein said load circuit is a depletion type MOS transistor, and an absolute value of a threshold voltage of each of said depletion type MOS transistors is higher than an absolute value of a threshold voltage of each of said control MOS transistors.

11. A decoder circuit comprising:
a main decoder including a plurality of first MOS transistors connected in parallel one another for receiving at the gates a selection signal, a first MOS transistor for receiving at the gate a first input signal connected between a high potential power source and one end of the drain-source path of each of said first MOS transistor, a plurality of second MOS transistors connected between said one ends of said first MOS transistors and word lines corresponding to said one ends, a plurality of third MOS transistors of which drain-source paths are respectively connected at one ends to the word line said terminals of said second MOS transistors, and a second control MOS transistor of which the drain-source path is connected at one end to said one ends of the drain-source paths of said first MOS transistors, and receives at the gate a second input signal out of phase with respect to said first input signal; and
means connected to the other end of said second control MOS transistor in said main decoder, and for supplying a potential of the gate potential of said first control MOS transistor or more to the source of said first control MOS transistor in a power down mode.

12. A semiconductor memory device comprising:
a plurality of column lines;

a plurality of row lines crossing said column lines;

memory cells each including an MOS transistor disposed at cross points of said column lines and said row lines, the drain of each said MOS transistor being connected to a corresponding column line; and means connected between a high potential power source and a low potential power source for applying a signal at a given potential between high and low potentials of said power sources to the source of said MOS transistor constituting each memory cell, said signal applying means comprising an MOS transistor which is connected at one end of the drain-source path to ground and at the other end to one end of the drain-source path of the MOS transistors of said memory cells.

13. A semiconductor integrated circuit device comprising:

a high potential power source;

a low potential power source;

a circuit for applying an intermediate potential between said high and low potentials to a circuit point, said intermediate potential applying circuit including a first MOS transistor having a drain-source path connected at one end of said high potential power source and having a gate connected to a predetermined voltage, a differential amplifier circuit connected at one of the input terminals to a voltage signal at the other end of the drain-source path of said first MOS transistor and at another input terminal to a voltage at said circuit point, an intermediate amplifier circuit for receiving an output signal from said differential amplifier circuit, and an MOS transistor having a gate receiving an output signal from said intermediate amplifier circuit, and having a drain-source path being connected between said circuit point and said low potential power source; and a logic circuit connected to said high potential power source and said circuit point and operating in a voltage range between the potentials of said high potential power source and at said circuit point.

* * * * *